United States Patent
Hwang

(10) Patent No.: US 10,217,802 B2
(45) Date of Patent: Feb. 26, 2019

(54) ORGANIC LIGHT-EMITTING DISPLAY DEVICE WITH HIGH RESOLUTION AND HIGH DEFINITION

(71) Applicant: LG Display Co., Ltd., Seoul (KR)

(72) Inventor: JaeSik Hwang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 10 days.

(21) Appl. No.: 15/607,956

(22) Filed: May 30, 2017

(65) Prior Publication Data

US 2017/0345877 A1 Nov. 30, 2017

(30) Foreign Application Priority Data

May 31, 2016 (KR) .................. 10-2016-0067616
Dec. 23, 2016 (KR) .................. 10-2016-0177962

(51) Int. Cl.
*H01L 27/32* (2006.01)

(52) U.S. Cl.
CPC ...... *H01L 27/3211* (2013.01); *H01L 27/3276* (2013.01)

(58) Field of Classification Search
None
See application file for complete search history.

(56) References Cited

U.S. PATENT DOCUMENTS

| 2014/0167009 A1 | 6/2014 | Lee et al. |
| 2014/0217397 A1 | 8/2014 | Kwak et al. |
| 2014/0320385 A1* | 10/2014 | Kwon .................. G09G 3/3233 345/82 |

FOREIGN PATENT DOCUMENTS

| KR | 10-2014-0077002 A | 6/2014 |
| KR | 10-2014-0099139 A | 8/2014 |
| KR | 10-2014-0127047 A | 11/2014 |
| KR | 10-2016-0013446 A | 2/2016 |

OTHER PUBLICATIONS

Office Action dated Jan. 3, 2017 for corresponding Korean Patent Application No. 10-2016-0067616.

* cited by examiner

*Primary Examiner* — Daniel Whalen
(74) *Attorney, Agent, or Firm* — Morgan, Lewis & Bockius LLP

(57) ABSTRACT

An organic light-emitting display (OLED) device includes a substrate having a display area including a plurality of sub-pixels each comprising an anode, an organic emitting layer and a cathode, a first data line on the substrate and applying a first data voltage to a first sub-pixel emitting light of a first color and to a second sub-pixel emitting light of a second color different from the first color, and a first line disposed between the first data line and an anode overlapping the first data line among the anodes of the plurality of sub-pixels. Parasitic capacitance that may occur between the first data line and the anode overlapping with the first data line can be reduced, and color change in the sub-pixels can be suppressed.

21 Claims, 18 Drawing Sheets

ORGANIC LIGHT-EMITTING DISPLAY DEVICE WITH HIGH RESOLUTION AND HIGH DEFINITION

CROSS-REFERENCE TO RELATED APPLICATIONS

This application claims the priority of Korean Patent Application No. 10-2016-0067616 filed on May 31, 2016 and the priority of Korean Patent Application No. 10-2016-0177962 filed on Dec. 23, 2016, in the Korean Intellectual Property Office, the disclosure of which is incorporated herein by reference in its entirety.

BACKGROUND

Technical Field

The present disclosure relates to an organic light-emitting display (OLED) device, and more particularly, to an OLED device capable of suppressing interference that may occur between a line and an organic light-emitting element while achieving high resolution and high definition by disposing a plurality of lines on different layers using a planarization layer so that they are insulated from one another.

Description of the Related Art

An organic light-emitting display (OLED) device includes an organic light-emitting element including an organic emitting layer, an anode and a cathode, and driving elements for driving the organic light-emitting element, such as a transistor, a capacitor, etc. In detail, an OLED device utilizes the phenomenon that holes injected from the anode and electrons injected from the cathode recombine in the emitting layer to form excitons, such that light of a particular wavelength is generated as an energy is released when the excitons relax from an excited state to the ground state.

An OLED device is capable of producing light in its own and thus does not require any additional light source, unlike a liquid-crystal display (LCD) device. Therefore, an OLED device can be made lighter and thinner than an LCD device. And, an OLED device has advantages in that it is driven with low voltage to consume less power, and that it has shorter response time, wider viewing angle and good contrast ratio (CR). For these reasons, an OLED device is currently under development as the next generation display device.

An OLED device includes a plurality of sub-pixels connected to a plurality of lines. Each of the plurality of sub-pixels includes a thin-film transistor, a capacitor, and an organic light-emitting element. The thin-film transistor and the capacitor may be connected to lines to transmit driving current to the organic light-emitting element based on the electrical signals on the lines.

Recently, as demand for a high-resolution OLED device has increased, researches have been made to densely dispose lines, thin-film transistors, capacitors, and organic light-emitting elements, etc. As the lines, the thin-film transistors, the capacitors and the organic light-emitting elements are densely disposed, the lines and the organic light-emitting elements may overlap with each other in some areas.

As the lines and the organic light-emitting elements overlap with one another, interference may be caused by signal applied to the lines in the organic light-emitting element. For example, parasitic capacitance may be formed between the anode of the organic light-emitting element of a sub-pixel and a data line. Such parasitic capacitance causes crosstalk between the anode and the data line and may result in interference on the voltage applied to the anode. As a result, the amount of the driving current flowing in the organic light-emitting element is changed, and accordingly ripples are generated, which may result in a change in the luminance of the organic light-emitting element.

As mentioned above, as an OLED device does not require any additional light source unlike an LCD device, the OLED device can be made lighter and thinner, and thus it is easier to fabricate a flexible OLED device. Accordingly, OLED devices can find a variety of applications in mobile phones, smart watches, laptop computers, tablet PCs, TVs, etc.

The flexible display device may include a curved display device, a bendable display device, a foldable display device, a rollable display device, etc. The flexible display device can reduce the width of the bezel to make viewers get immersed into the contents displayed on the screen. The width of the bezel can be reduced by bending or folding the non-display area of the flexible display device. A large display device can be implemented by connecting such flexible display devices with the reduced bezel with one another. For example, a large display device may be implemented by tiling multiple display devices.

In order to bend or fold the non-display area of a display device, it is necessary to make the lines disposed in the bending area robust against the bending stress. By increasing the width of the lines to withstand the bending stress, it is possible to suppress cracking or disconnection of the lines. And, in a high-resolution display device, the number of lines to be disposed in a given area of the non-display area is increased, such that the maximum width of the lines is limited.

Therefore, in order to dispose a plurality of lines in a given area of the non-display area, it is contemplated to reduce the width of lines for transmitting signals or reduce the spacing between the lines, for example. And, if the width of the lines is reduced, the resistance may increase such that a voltage drop may occur, whereby the luminance of the OLED device may become uneven. In addition, if the spacing between the transistors and the lines is reduced, short-circuit may be formed therebetween.

Under the circumstances, what is required is an OLED device capable of suppressing the above-described defects while achieving high definition.

SUMMARY

The inventors of the application have studied various sub-pixel structures of OLED devices. In detail, the inventors of the application have designed various arrangements, i.e., locations and sizes of a plurality of sub-pixels, taking into account lifetime characteristics, luminance characteristics, material characteristics, etc. for each of the plurality of sub-pixels.

Among the variously designed arrangements of the plurality of sub-pixels, there is a structure in which a data voltage is applied to sub-pixels emitting light of different colors via a single data line. For example, two of a red sub-pixel, a green sub-pixel and a blue sub-pixel are alternately connected to a single data line while the other of the red sub-pixel, the green sub-pixel and the blue sub-pixel is connected to another data line. When an ordinary image is displayed in such a sub-pixel structure, AC voltage is applied to the data line as the scenes keep changing at every frame. As a result, interference may be caused between the data line and the anode. And, in such an ordinary image, the scenes change almost at every frame and the data voltage fluctuates, and accordingly the duration of the interference is very short. Accordingly, the inventors of the application have found that viewers cannot recognize interference that may occur between the data line and the anode in an ordinary image.

In addition, the inventors of the application have found that viewers may perceive a color that is different from a desired color in the above-described sub-pixel structure when the monochromatic image of one color is displayed on the entire screen or at a portion of the screen of the OLED device for a long time. For example, let us assume that a red sub-pixel and a blue sub-pixel are alternately connected to one data line and a green sub-pixel is connected to another data line. When red is displayed on the entire screen, the green sub-pixel and the blue sub-pixel have to be turned off and only the red sub-pixel has to be turned on. And, since the red sub-pixel and the blue sub-pixel are connected to the same data line, an AC voltage swinging between high level and low level is applied to the data line. Accordingly, as the AC voltage is applied to the data line for applying the data voltage to the sub-pixels emitting light of different colors for a long time, interference may be caused between the data line and the anode overlapping with the data line. Accordingly, the amount of the driving current flowing in the organic light-emitting element may be changed, causing a problem that the luminance of the organic light-emitting element changes or an undesired color is perceived by viewers.

To overcome the above-described problems, the inventors of the application have devised an OLED device having a novel structure. In addition, the inventors of the application have devised an OLED device capable of reducing stress on lines disposed in a bending area when the various sub-pixel structures are implemented in a flexible display device while reducing the bezel.

Accordingly, embodiments of the present disclosure are directed to an organic light-emitting display device that substantially obviates one or more of the problems due to limitations and disadvantages of the related art.

In view of the above, an object of the present disclosure is to provide an OLED device capable of reducing parasitic capacitance that may occur between a data line and an anode when data voltage is applied to sub-pixels emitting light of different colors via the data line.

Another object of the present disclosure is to provide an OLED device capable of reducing color change in sub-pixels by suppressing crosstalk that may occur in a sub-pixel overlapping a data line connected to sub-pixels emitting light of different colors.

Yet another object of the present disclosure is to provide an OLED device achieving high resolution and high definition by isolating a plurality of lines from one another with a planarization layer and disposing the plurality of lines on different layers.

Yet another object of the present disclosure is to provide an OLED device capable of reducing the bezel width by isolating a plurality of lines from one another to reduce spacing between the lines and by disposing a planarization layer over the plurality of lines to bend or fold the substrate.

Additional features and aspects will be set forth in the description that follows, and in part will be apparent from the description, or maybe learned by practice of the inventive concepts provided herein. Other features and aspects of the inventive concepts may be realized and attained by the structure particularly pointed out in the written description, or derivable therefrom, and the claims hereof as well as the appended drawings.

According to embodiment of the present disclosure, an organic light-emitting display (OLED) device comprises a substrate having a display area including a plurality of sub-pixels each comprising an anode, an organic emitting layer and a cathode, a first data line disposed on the substrate and configured to apply a first data voltage to a first sub-pixel emitting light of a first color and to a second sub-pixel emitting light of a second color different from the first color, and a first line disposed between the first data line and an anode overlapping the first data line among the anodes of the plurality of sub-pixels. Parasitic capacitance that may occur between the first data line and the anode overlapping with the first data line can be reduced, and color change in the sub-pixels can be suppressed.

According to another embodiment of the present disclosure, an organic light-emitting display (OLED) device comprises a first data line applying a data voltage to sub-pixels emitting light of different colors, a plurality of first anodes disposed to overlap with the first data line above the first data line, and a first line disposed between the first data line and the plurality of first anodes such that the first line suppresses interference between the first data line and the plurality of first anodes when the OLED device displays a single color to thereby reduce variations in luminance among the sub-pixels comprising the plurality of first anodes. When the OLED device displays a single color, it is possible to suppress interference caused in a sub-pixel overlapping a first data line supplying data voltage to sub-pixels emitting light of different colors by the first data line.

Particulars of the embodiments of the present disclosure will be described in the detail description with reference to the accompanying drawings.

According to an embodiment of the present disclosure, by disposing a line between a data line and an anode of a sub-pixel, it is possible to suppress interference between the data line and the anode of the sub-pixel when AC voltage is transferred via the data line when the OLED device display a single color.

In addition, according to an embodiment of the present disclosure, by disposing a line between a data line and an anode of a sub-pixel, it is possible to reduce parasitic capacitance that may occur between the data line and the anode to decrease variations in luminance of the sub-pixel in which the anode is disposed.

In addition, according to an embodiment of the present disclosure, by disposing a line between a data line connected to sub-pixels emitting light of different colors and an anode of a sub-pixel, it is possible to reduce crosstalk between the data line and the anode overlapping with the data line, thereby reducing color change of the pixel and providing pixel stability.

Further, according to an embodiment of the present disclosure, by disposing a voltage supply line between a data line and an anode of a sub-pixel, it is possible to achieving high definition of pixels and obtaining design space for driving elements.

Moreover, by disposing a connection line that connects a first line with a second line, it is possible to suppress interference between the data line and the anode by the first line.

Further, according to an embodiment of the present disclosure, a first link line and a second link line are disposed on different layers, such that spacing between the first link line and the second link line can be reduced, thereby implementing a high-resolution OLED device.

In addition, according to an embodiment of the present disclosure, by disposing an anti-disconnection protective layer over a first link line and a second link line disposed on different layers, it is possible to suppress cracking or disconnection of a plurality of link lines that may take place when the non-display area of the OLED device is bent.

Further, according to an embodiment of the present disclosure, a portion of the substrate in the non-display area where a plurality of link lines is disposed for transferring signals can be bent, such that the bezel width of the OLED device can be reduced.

Further, according to an embodiment of the present disclosure, a material having a small Young's modulus is used for a plurality of link lines, such that the plurality of link lines can be easily deformed when the OLED device is bent, thereby suppressing cracking or disconnection of the plurality of link lines.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
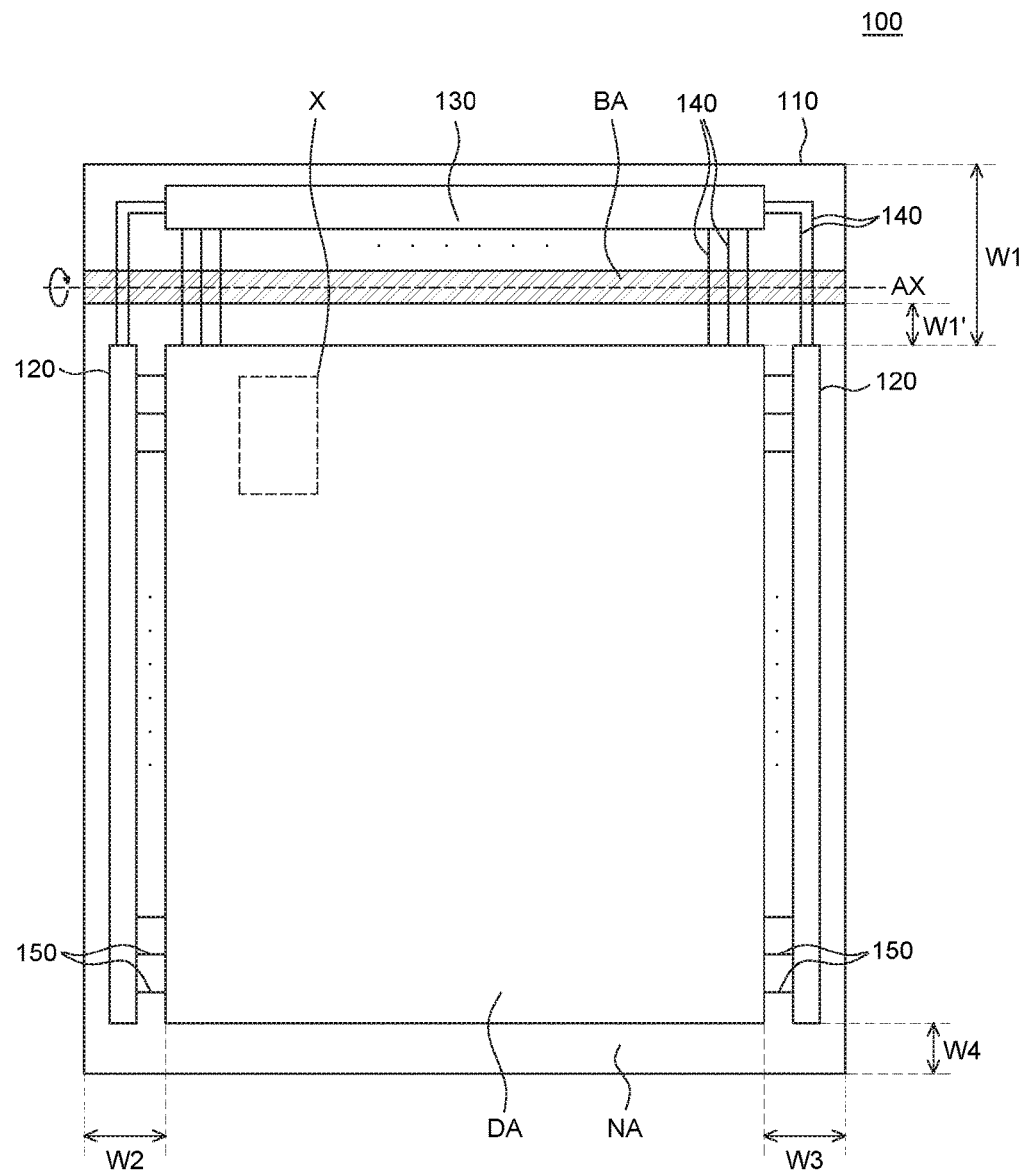
FIG. 1 is a schematic plan view of an organic light-emitting display (OLED) device according to an embodiment of the present disclosure.

Advantages and features of the present disclosure and methods to achieve them will become apparent from the descriptions of embodiments hereinbelow with reference to the accompanying drawings. However, the present disclosure is not limited to embodiments disclosed herein but may be implemented in various different ways. The embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. And, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," and "the," this includes a plural of that noun unless specifically stated otherwise.

For elements having specific values, they are interpreted as including error margins even without explicit statements.

In describing locational relationship, such as "an element A on an element B," "an element A above an element B," "an element A below an element B," and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second and the like in the descriptions and in the claims are used for distinguishing between similar elements and not necessarily for describing a sequential or chronological order. Theses terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various embodiments of the present disclosure may be combined partially or totally. As will be clearly appreciated by those skilled in the art, technically various interactions and operations are possible. Various embodiments can be practiced individually or in combination.

Hereinafter, embodiments of the present disclosure will be described in detail with reference to the accompanying drawings.

FIG. 1 is a schematic plan view of an organic light-emitting display (OLED) device according to an embodiment of the present disclosure. Referring to FIG. 1, an OLED device 100 may include a substrate 110, a gate driver 120, a drive IC 130, and lines 140 and 150.

The substrate 110 supports thereon a variety of elements of the OLED device 100. The substrate 110 may be made of a transparent, insulating material such as glass, plastic, etc. In particular, if the OLED device 100 is implemented as a flexible OLED device, the substrate 110 may be made of an insulating material having flexibility such as plastic.

On the substrate 110, a display area DA and a non-display area NA may be defined. The display area DA is an area of the OLED device 100 where images are displayed. The display area DA may include a plurality of sub-pixels, each of which is a unit for representing a color. The plurality of sub-pixels may include, for example, a red sub-pixel, a green sub-pixel, and a blue sub-pixel. The red sub-pixel, the green sub-pixel and the blue sub-pixel may represent a desired color as a group. Each of the plurality of sub-pixels includes an organic light-emitting element composed of an anode, an organic emitting layer, and a cathode. A more detailed description of the sub-pixel including the organic light-emitting element will be given below with reference to FIGS. 2A to 2C.

The non-display area NA is an area where a plurality of link lines is disposed and no image is displayed, which may also be referred to as a bezel. The width of the non-display area on the plane may be referred to as a bezel width. As shown in FIG. 1, the substrate 110 may include four sides, and the non-display area NA maybe formed around the display area DA with a predetermined width. Therefore, the non-display area NA may be defined as an area surrounding the display area DA. It is to be understood that the formation and arrangement of the display area DA and the non-display area NA may vary depending on the design choice. In the non-display area NA, various elements for driving the plurality of sub-pixels disposed in the display area DA may be disposed. For example, as shown in FIG. 1, the gate driver 120, the drive IC 130, the lines 140 and 150, etc. may be disposed in the non-display area NA of the substrate 110.

The gate driver 120 outputs a scan signal and an emission control signal under the control of a timing controller to select a sub-pixel to be charged with a data voltage through a line 150 such as a scan line and an emission control signal line, and may control emission timing. The gate driver 120 shifts scan signals and emission control signals by using a shift register and sequentially supplies the scan signals and the emission control signals to the lines 150, such that the signals may be supplied to the gate lines, the emission control signal lines, etc. disposed in the display area DA. The shift register of the gate driver 120 may be formed directly on the substrate 110 as shown in FIG. 1 as a Gate-driver In Panel (GIP). However, this is merely illustrative.

The drive IC 130 may be disposed on the OLED device 100 and may apply signals to the plurality of lines 140 disposed on the substrate 110. The plurality of lines 140 may include a data link line for applying a data signal to a data line disposed in the display area DA, a voltage supply link line for applying power signal to a high-potential voltage supply line or a low-potential voltage supply line disposed in the display area DA, a gate link line to transmit a signal to the gate driver 120, a link line such as initialization voltage link line, etc.

The drive IC 130 may include a data driver for converting the digital data of an input image received from the timing controller at every frame of the image displayed on the OLED device 100 into a data voltage to output the data voltage. The timing controller may be integrated with the drive IC 130 in some implementations of the OLED device 100. The data driver of the drive IC 130 may output a data voltage using a digital-to-analog converter (DAC) that converts the digital data into a gamma correction voltage, for example.

Although the drive IC 130 is shown as being disposed directly on the substrate 110 in FIG. 1, the drive IC 130 may be disposed on a flexible printed circuit board, and the flexible printed circuit board is attached to the substrate 110, such that a signal from the drive IC 130 may be transmitted to the lines 140.

A space for disposing the drive IC 130 and the plurality of lines 140 is required on one side of the substrate 110 (upper side in FIG. 1). In some embodiments of the present disclosure, an additional space for disposing a flexible printed circuit board is required. The width W1 of the non-display area NA on the side of the substrate 110 (upper side in FIG. 1) may be larger than the bezel widths W2, W3 and W4 of the three sides of the substrate 110 (left side, right side and lower side in FIG. 1). The gate drivers 120 may be disposed in the left and right non-display areas NA of the OLED device 100. And, since the width of the gate drivers 120 is very small, it does not substantially affect the left and right bezel widths W2 and W3. That is, the lower bezel width W4, the left bezel width W2 and the right bezel width W3 of the non-display areas NA can be sufficiently small, but the upper bezel width W1 of the non-display area NA may not be as small as the lower bezel width W4, the left bezel width W2 and the right bezel width W3.

When bending and folding the flexible printed circuit board to reduce the wide bezel width, there is a high possibility that the lines disposed in the folded area of the flexible printed circuit board are disconnected because the flexible circuit board in the form of a film is difficult to protect the lines. In addition, even if the non-display area NA under the substrate 110 where the flexible printed circuit board is attached is made as small as possible, the flexible printed circuit board can be folded to be smaller than the size of the substrate 110.

Therefore, in order to implement a small bezel width of the completed OLED device 100, by bending and folding the non-display area NA on the upper side of the substrate 110 where the drive IC 130 is disposed or the flexible printed circuit board is attached, the bezel width W1' on the upper side of the OLED device 100 can be as small as the remaining three bezel widths W2, W3 and W4. In this regard, the bending area BA may be defined as a region where the substrate 110 and the lines and insulating layers stacked on the substrate 110 are extended when the substrate 110 is bent and folded with respect to the bending axis AX.

Hereinafter, a plurality of sub-pixels defined on the substrate 110 of the OLED device 100 according to an embodiment of the present disclosure will be described in detail with reference to FIGS. 2A to 2C.

Figure 2A:
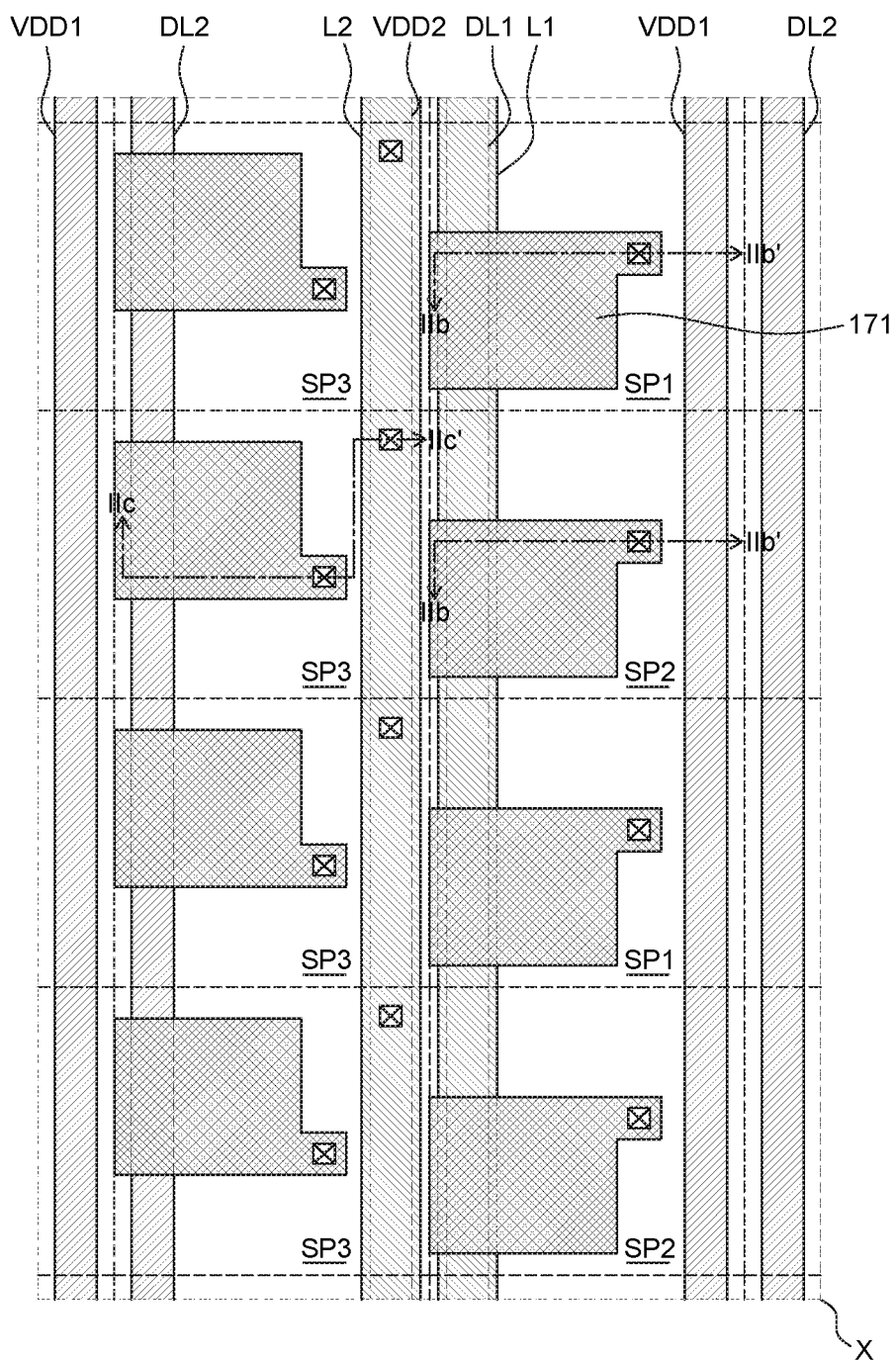
FIG. 2A is an enlarged view of area X shown in FIG. 1.

FIG. 2A is an enlarged view of area X shown in FIG. 1. FIG. 2B is a cross-sectional view taken along line IIb-IIb' of FIG. 2A. FIG. 2C is a cross-sectional view taken along line IIc-IIc' of FIG. 2A.

Figure 2B:
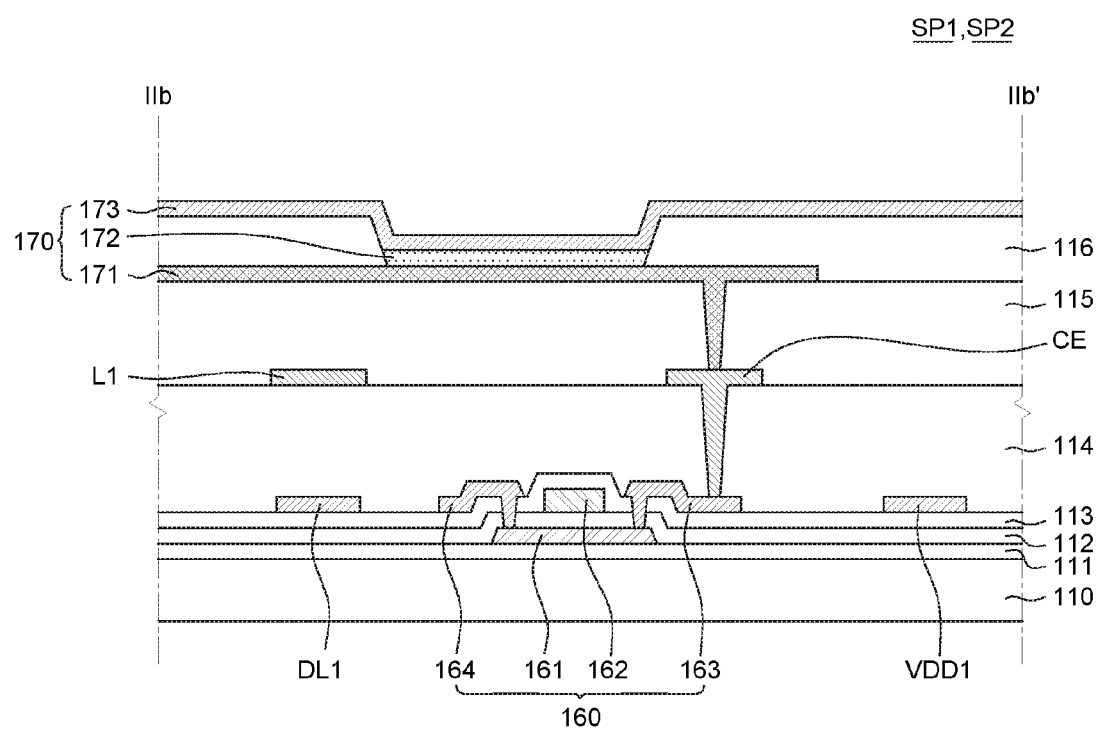
FIG. 2B is a cross-sectional view taken along line IIb-IIb' of FIG. 2A.
Figure 2C:
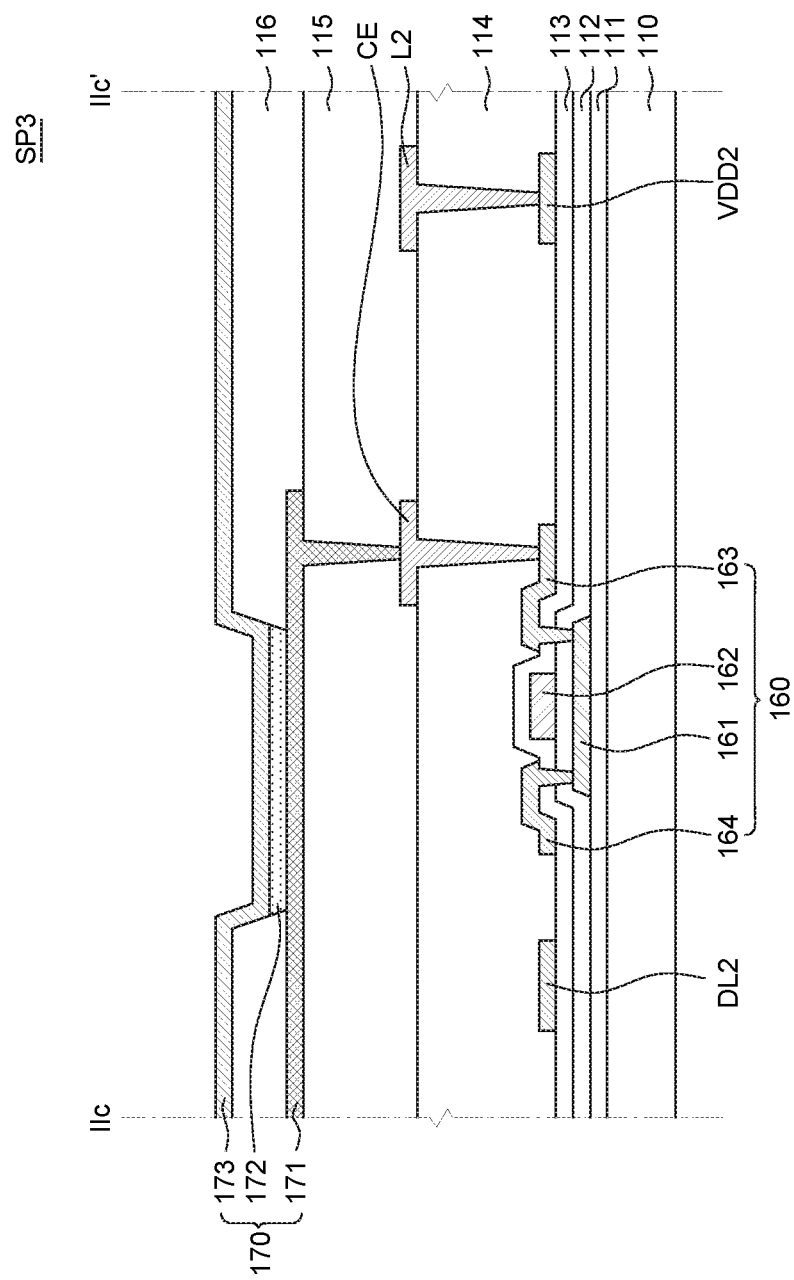
FIG. 2C is a cross-sectional view taken along line IIc-IIc' of FIG. 2A.

Referring to FIGS. 2A to 2C, the OLED device 100 includes a first data line DL1, a second data line DL2, a first voltage supply line VDD1, a second voltage supply line VDD2, a first line L1, a second line L2, a thin-film transistor 160, and an organic light-emitting element 170. In FIG. 2A, for convenience of illustration, the anode 171 of the organic light-emitting element 170, the first data line DL1, the second data line DL2, the first voltage supply line VDD1, the second voltage supply line VDD2, the first line L1 and the second line L2 disposed on the substrate 110 are depicted, and the other components are not shown. In FIG. 2B, the first sub-pixel SP1 and the second sub-pixel SP2 have substantially the same cross-sectional structure, and thus the cross-sectional structure of the first sub-pixel SP1 and the second sub-pixel SP2 will be described together.

Referring to FIG. 2A, the substrate 110 may include a plurality of sub-pixels SP1, SP2 and SP3. The plurality of sub-pixels SP1, SP2 and SP3 may be arranged on the substrate 110 in a matrix. Although the plurality of sub-pixels SP1, SP2 and SP3 each having a quadrangular shape may be arranged in a matrix as shown in FIG. 2A, for example, but the shape of the sub-pixels is not limited herein.

The plurality of sub-pixels SP1, SP2 and SP3 may include a first sub-pixel SP1, a second sub-pixel SP2 and a third sub-pixel SP3. The first sub-pixel SP1, the second sub-pixel SP2 and the third sub-pixel SP3 emit light of different colors. In detail, the first sub-pixel SP1 emits light of a first color, the second sub-pixel SP2 emits light of a second color different from the first color, the third sub-pixel SP3 emits light of a third color different from the first and second colors. For example, each of the first sub-pixel SP1, the second sub-pixel SP2 and the third sub-pixel SP3 may be one of a red sub-pixel for emitting red light, a green sub-pixel for emitting green light, and a blue sub-pixel for emitting blue light. In the following description, the first sub-pixel SP1 is a red sub-pixel, the second sub-pixel SP2 is a blue sub-pixel, and the third sub-pixel SP3 is a green sub-pixel. However, the colors are not limited thereto as long as they emit light of different colors.

Among the plurality of sub-pixels SP1, SP2 and SP3, the first sub-pixel SP1 and the second sub-pixel SP2 may be arranged in the same column. In detail, as shown in FIG. 2A, the first sub-pixel SP1 and the second sub-pixel SP2 may be alternately arranged in the same column. Among the plurality of sub-pixels SP1, SP2 and SP3, the third sub-pixel SP3 may be disposed in a column different from the column where the first and second sub-pixels SP1 and SP2 are disposed. For example, as shown in FIG. 2A, the column next to the column where the first sub-pixels SP1 and the second sub-pixels SP2 are alternately arranged may be composed of the third sub-pixels SP3 only. As the first sub-pixel SP1, the second sub-pixel SP2 and the third sub-pixel SP3 are arranged in the above-mentioned manner, the first sub-pixels SP1 and the second sub-pixels SP2 arranged alternately in a column, and the third sub-pixels SP3 arranged in the next column may be repeatedly arranged on the substrate 110.

In FIG. 2A, the plurality of sub-pixels SP1, SP2 and SP3 all have a quadrangular shape and have the same size. However, this is not limiting. That is, by taking into account the efficiency of the arrangement of the plurality of sub-pixels SP1, SP2 and SP3 and luminance characteristics, the plurality of sub-pixels SP1, SP2 and SP3 may have other shapes than the quadrangular shape. In addition, the plurality of sub-pixels SP1, SP2 and SP3 may have different shapes. Likewise, the sizes of the plurality of sub-pixels SP1, SP2 and SP3 may be variously set taking into account the lifetime characteristics, luminance characteristics, etc. of each of the plurality of sub-pixels SP1, SP2 and SP3. For example, in some embodiments, the size of the second sub-pixel SP2 may be set to be greater than the size of the first sub-pixel SP1 or the size of the third sub-pixel SP3 taking into account the lifetime characteristics, luminance characteristics, etc.

Referring to FIG. 2A, the first data line DL1, the second data line DL2, the first voltage supply line VDD1 and the second voltage supply line VDD2 may be disposed on the substrate 110.

The first data line DL1 and the second data line DL2 may be spaced apart from each other and may extend parallel to each other on the substrate 110, for example. The first data line DL1 and the second data line DL2 may provide data voltages to the sub-pixels connected to the first data line DL1 and the second data line DL2, respectively. In detail, the first data line DL1 provides the data voltage to the first sub-pixel SP1 and the second sub-pixel SP2 connected to the first data line DL1, and the second data line DL2 provides the data voltage to the third sub-pixel SP3. Since the first data line DL1 and the second data line DL2 provide different data voltages, they are not connected to each other.

The first voltage supply line VDD1 and the second voltage supply line VDD2 may be spaced apart from each other and may extend parallel to each other on the substrate 110, for example. The first voltage supply line VDD1 and the second voltage supply line VDD2 may be spaced apart from the first data line DL1 and the second data line DL2 on the substrate 110 and extend parallel to each other. The first voltage supply line VDD1 and the second voltage supply line VDD2 may transmit a high-potential voltage to the sub-pixels connected to the first voltage supply line VDD1 and the second voltage supply line VDD2. In detail, the first voltage supply line VDD1 may provide a high-potential voltage to the first sub-pixel SP1 and the second sub-pixel SP2 connected to it, and the second voltage supply line VDD2 may provide a high-potential voltage to the third sub-pixel SP3. The high-potential voltage transferred by the first voltage supply line VDD1 and the high-potential voltage transferred by the second voltage supply line VDD2 may be constant voltages. In addition, the same constant voltage may be provided to the first sub-pixel SP1, the second sub-pixel SP2 and the third sub-pixel SP3 via the first voltage supply line VDD1 and the second voltage supply line VDD2. In some embodiments, the first voltage supply line VDD1 and the second voltage supply line VDD2 may be electrically connected to each other in the non-display area NA of the substrate 110.

The organic light-emitting element 170 is disposed on the first data line DL1, the second data line DL2, the first voltage supply line VDD1 and the second voltage supply line VDD2. The organic light-emitting element 170 may be disposed in each of the plurality of sub-pixels SP1, SP2 and SP3. In FIG. 2A, only the anode 171 among the components of the organic light-emitting element 170 is shown for convenience of description. The organic light-emitting element 170 will be described in detail below with reference to FIGS. 2B and 2C.

Referring to FIG. 2A, the anode 171 may be disposed in each of the plurality of sub-pixels SP1, SP2 and SP3. In FIG. 2A, the anode 171 has a quadrangular shape, and the plurality of sub-pixels SP1, SP2 and SP3 all have the same size and the shape. In addition, in FIG. 2A, the anode 171 of the first sub-pixel SP1 and the anode 171 of the second sub-pixel SP2 connected to the first data line DL1 and the anode 171 of the three sub-pixel SP3 connected to the second data line DL2 are arranged in a zigzag pattern. And, the size, shape and arrangement of the anode 171 can be variously set taking into account the arrangement efficiency, the luminance characteristic, the lifespan characteristic of the OLED device 170.

The anode 171 may overlap with various lines such as the first data line DL1, the second data line DL2, the first voltage supply line VDD1 and the second voltage supply line VDD2. In FIG. 2A, the anode 171 of the first sub-pixel SP1 and the anode 171 of the second sub-pixel SP2 overlap with the first data line DL1, while the anode 171 of the third sub-pixel SP3 overlaps with the second data line DL2.

As mentioned above, since the first sub-pixel SP1 and the second sub-pixel SP2 emitting light of different colors receive the data voltage from the first data line DL1, there may occur interference between the first data line DL1 and the anode 171 overlapping with the first data line DL1. To avoid this, in the OLED device 100 according to an embodiment of the present disclosure, the first line L1 is disposed between the first data line DL1 and the anode 171 overlapping with the first data line DL1, among the anodes 171 of the plurality of sub-pixels SP1, SP2 and SP3. Hereinafter, the cross-sectional structure of the OLED device 100 will be described in detail below with reference to FIGS. 2B and 2C.

Referring to FIG. 2B, a buffer layer 111 is formed on the substrate 110. The buffer layer 111 may be a single layer of silicon nitride ($SiN_x$) or silicon oxide ($SiO_x$), or multiple layers of silicon nitride ($SiN_x$) and silicon oxide ($SiO_x$). The buffer layer 111 enhances the adhesion between the layers formed on the buffer layer 111 and the substrate 110 and may block moisture or oxygen permeating through the substrate 110. It is to be understood that the buffer layer 111 is not an essential component and may be eliminated depending on the type and material of the substrate 110, the structure and type of the thin-film transistor 160, etc.

The thin-film transistor 160 for driving the organic light-emitting element 170 is formed on the buffer layer 111. In detail, an active layer 161, where a channel of the thin-film transistor 160 is to be formed, is disposed on the buffer layer 111. A gate electrode 162 is disposed on the active layer 161. A gate insulating layer 112 for insulating the active layer 161 from the gate electrode 162 is disposed between the active layer 161 and the gate electrode 162. The gate insulating layer 112 may be patterned so that it has the same width as the gate electrode 162, but is not limited thereto.

An interlayer insulating layer 113 is disposed on the gate electrode 162. A source electrode 163 and a drain electrode 164 are disposed on the interlayer insulating layer 113 and are electrically connected to the active layer 161 via the contact holes in the gate insulating layer 112 and the interlayer insulating layer 113. The active layer 161 may be formed of an oxide semiconductor such as ITO (Indium Tin Oxide), IZO (Indium Zinc Oxide), IGZO (Indium Gallium Zinc Oxide), or ITZO (Indium Tin Zinc Oxide), or may be formed of an amorphous silicon (a-Si), a polycrystalline silicon (poly-Si), an organic semiconductor, etc.

The gate electrode 162, the source electrode 163 and the drain electrode 164 may be formed of one of various metal materials such as molybdenum (Mo), aluminum (Al), chrome (Cr), gold (Au), nickel (Ni), neodymium (Nd) and copper (Cu), or an alloy of two or more thereof, or multiple layers thereof.

In addition, the gate insulating layer 112 and the interlayer insulating layer 113 may be formed of a single layer of silicon nitride (SiNx) or silicon oxide (SiOx), or multiple layers of silicon nitride (SiNx) and silicon oxide (SiOx). In FIG. 2A, only the driving thin-film transistor 160 is depicted as the thin-film transistor 160 for driving the organic light-emitting element 170 for convenience of illustration. And, a switching thin-film transistor, a capacitor, etc. may be disposed between the substrate 110 and the organic light-emitting element 170.

In the first sub-pixel SP1 and the second sub-pixel SP2, the first data line DL1 and the first voltage supply line VDD1 are disposed on the interlayer insulating layer 113. The first data line DL1 is for supplying a data voltage to the first sub-pixel SP1 and the second sub-pixel SP2. The first voltage supply line VDD1 is for supplying a high-potential voltage to the first sub-pixel SP1 and the second sub-pixels SP2.

The first data line DL1 and the first voltage supply VDD1 maybe formed of a conductive metal such as molybdenum (Mo), aluminum (Al), chromium (Cr), gold (Au), titanium (Ti), nickel (Ni), neodymium (Nd) and copper (Cu), an alloy of two or more thereof, or multiple layers thereof. In addition, the first data line DL1 and the first voltage supply line VDD1 may be formed on the interlayer insulating layer 113 with the same material as the source electrode 163 and the drain electrode 164 simultaneously with them.

A first planarization layer 114 is disposed on the thin-film transistor 160, the first data line DL1, and the first voltage supply line VDD1. The first planarization layer 114 is an insulating layer that protects the thin-film transistor 160 and reduces the level differences on the substrate 110 created by the thin-film transistor 160, the first data line DL1 and the first voltage supply line VDD1, to provide a flat surface over the substrate 110. The first planarization layer 114 may be formed of, but is not limited to, on of acrylic resin, epoxy resin, phenol resin, polyamide resin, polyimide resin, unsaturated polyester resin, polyphenylene resin, polyphenylene sulfide resin, benzocyclobutene and photoresist.

The second planarization layer 115 is disposed on the first planarization layer 114. The second planarization layer 115 is an insulating layer for providing a flat surface over the first planarization layer 114. The second planarization layer 115 may be formed of, but is not limited to, on of acrylic resin, epoxy resin, phenol resin, polyamide resin, polyimide resin, unsaturated polyester resin, polyphenylene resin, polyphenylene sulfide resin, benzocyclobutene and photoresist. The second planarization layer 115 may be made of the same material as the first planarization layer 114.

In the OLED device 100 according to an embodiment of the present disclosure, the first planarization layer 114 and the second planarization layer 115 are used as the planarization layers for providing a flat surface over the thin-film transistor 160. As a result, an additional space can be provided where the various lines used in the OLED device 100 are disposed. That is, as compared with a sub-pixel with one planarization layer, a space between the first planarization layer 114 and the second planarization layer 115, that is, an additional space where lines can be disposed is provided on the first planarization layer 114. Therefore, the OLED device 100 according to the embodiment of the present disclosure can increase the degree of design freedom for arranging lines, etc.

The organic light-emitting element 170 and a bank 116 are disposed on the second planarization layer 115. The organic light-emitting element 170 includes an anode 171, an organic emitting layer 172 on the anode 171, and a cathode 173 on the organic emitting layer 172. In detail, the anode 171 is disposed on the second planarization layer 115, and the bank 116 is disposed such that it covers both ends of the anode 171 to define the emission area of the organic light-emitting element 170. The organic emitting layer 172 is disposed on the part of the anode 171 that is not covered by the bank 116, and the cathode 173 is disposed on the organic emitting layer 172 and the bank 116. The organic emitting layer 172 may emit light of a color that the sub-pixel is designated to produce. For example, when the first sub-pixel SP1 is a red sub-pixel and the second sub-pixel SP2 is a blue sub-pixel as described above, the organic emitting layer 172 of the first sub-pixel SP1 may emit red light, and the organic emitting layer 172 of the second sub-pixel SP2 may emit blue light. In addition, spacers may be formed on the bank 116 to prevent damage to the organic emitting element 170 when a fine metal mask (FMM) used to form the organic emitting layer 172 is brought into contact with the bank 116 or the anode 171.

Although only the organic emitting layer 172 is depicted as being disposed on the anode 171 in FIG. 2B, organic layers other than the organic emitting layer 172 may be additionally disposed, such as at least a hole injection layer, a hole transport layer, an electron blocking layer, an electron injection layer, a hole blocking layer, and an electron transporting layer. The hole injecting layer, the hole transport layer, the electron blocking layer, the electron injection layer, the hole blocking layer, or the electron transport layer maybe shared by all of the sub-pixels in the form of a single layer.

A connection electrode CE for electrically connecting the thin-film transistor 160 with the anode 171 is disposed on the first planarization layer 114. As the two planarization layers 114 and 115 are disposed between the thin-film transistor 160 and the organic light-emitting element 170, it may be difficult to electrically connect the anode 171 with the thin-film transistor 160 by a single process of forming a contact hole. In view of the above, in the OLED device 100 according to an embodiment of the present disclosure, the connection electrode CE electrically connected to the thin-film transistor 160 is disposed on the first planarization layer 114, such that the anode 171 disposed on the second planarization layer 115 is connected to the connection electrode CE via the contact hole in the second planarization layer 115. The connection electrode CE may be formed of a conductive metal such as molybdenum (Mo), aluminum (Al), chromium (Cr), gold (Au), titanium (Ti), nickel (Ni), neodymium (Nd) and copper (Cu), or an alloy of the two or more thereof, or multiple layers thereof.

In FIG. 2B, the anode 171 is electrically connected to the source electrode 163 of the thin-film transistor 160 via the connection electrode CE. And, depending on the type of the thin-film transistor 160 and the design choice of the driving circuit, the anode 171 may be electrically connected to the drain electrode 164 of the thin-film transistor 160 via the connection electrode CE.

As shown in FIG. 2B, the anode 171 of the first sub-pixel SP1 and the second sub-pixel SP2 overlaps with the first data line DL1. When the OLED device 100 displays a single color, especially the color represented by the first sub-pixel SP1 or the second sub-pixel SP2, the first data line DL1 alternately supplies voltage for turning on the first sub-pixel SP1 or the second sub-pixel SP2 and voltage for turning off the other one. Accordingly, the data voltage applied through the first data line DL1 may be an AC voltage. As AC data voltage is applied, parasitic capacitance may be generated between the first data line DL1 and the anode 171 of the first sub-pixel SP1 and the second sub-pixel SP2, such that interference maybe caused. Therefore, the luminance of the first sub-pixel SP1 or the second sub-pixel SP2 that is to be turned on may be changed, or the other one may be driven such that unwanted color is displayed, and accordingly the color change or luminance variation may take place.

To avoid this, in the OLED device 100 according to an embodiment of the present disclosure, the first line L1 is disposed between the first data line DL1 via which the data voltage is applied to the sub-pixels emitting light of different colors, that is, the first sub-pixel SP1 and the second sub-pixel SP2, and the anode 171 of the first sub-pixel SP1 and the second sub-pixel SP2 overlapping the first data line DL1. In detail, the first line L1 may overlap only with the first data line DL1 and not with the first voltage supply line VDD1 between the first planarization layer 114 and the second planarization layer 115. The first line L1 may be formed of a conductive metal such as molybdenum (Mo), aluminum (Al), chromium (Cr), gold (Au), titanium (Ti), nickel (Ni), neodymium (Nd) and copper (Cu), or an alloy of the two or more thereof, or multiple layers thereof. In addition, the first line L1 may be made of the same material as the connection electrode CE.

A constant voltage may be applied to the first line L1. As described above, in order to reduce the parasitic capacitance between the first data line DL1 and the anode 171 of the first sub-pixel SP1 and the second sub-pixel SP2, which may occur as the AC data voltage is applied as the first data voltage, the constant voltage may be applied to the first line L1. The constant voltage applied to the first line L1 may be the same as the high-potential voltage applied through the first voltage supply line VDD1. Accordingly, the first line L1 may be electrically connected to the first voltage supply line VDD1 in the non-display area NA outside the display area DA.

Then, referring to FIG. 2C, in the third sub-pixel SP3, a thin-film transistor 160, a first planarization layer 114, a connection electrode CE and an organic light-emitting element 170 are disposed on the substrate 110. Except that the color of the light emitted by the organic emitting layer 172 of the organic light-emitting element 170 of the third sub pixel SP3 is different from that of the first sub-pixel SP1 or the second sub-pixel SP2, the thin-film transistor 160, the first planarization layer 114, the connection electrode CE and the organic light-emitting element 170 shown in FIG. 2C are subsequent identical to the thin-film transistor 160, the first planarization layer 114, the connection electrode CE and the organic light-emitting element 170 shown in FIG. 2B, and, therefore, the redundant description will be omitted.

In the third sub-pixel SP3, the second data line DL2 and the second voltage supply line VDD2 are disposed on the interlayer insulating layer 113. The second planarization layer 115 may cover the second data line DL2 and the second voltage supply line VDD2 as well as the first data line DL1 and the first voltage supply line VDD1. The second data line DL2 is a line for supplying a data voltage to the third sub pixel SP3, while the second voltage supply line VDD2 is a line for supplying a high-potential voltage to the third sub-pixel SP3. The high-potential voltage supplied through the second voltage supply line VDD2 maybe a constant voltage, which may have a fixed value. The constant voltage supplied through the second voltage supply line VDD2 may be the same voltage as the constant voltage supplied through the first voltage supply line VDD1. Accordingly, the first voltage supply line VDD1 and the second voltage supply line VDD2 may be electrically connected to each other in the non-display area NA.

The second data line DL2 and the second voltage supply line VDD2 may be formed of a conductive metal such as molybdenum (Mo), aluminum (Al), chromium (Cr), gold (Au), titanium (Ti), nickel (Ni), neodymium (Nd) and copper (Cu), an alloy of two or more thereof, or multiple layers thereof. In addition, the second data line DL2 and the second voltage supply line VDD2 may be formed on the interlayer insulating layer 113 with the same material as the source electrode 163 and the drain electrode 164 simultaneously with them.

As shown in FIG. 2C, the anode 171 of the third sub-pixel SP3 overlaps with the second data line DL2. Since the second data line DL2 supplies the data voltage only to the third sub-pixel SP3, when the OLED device 100 displays a single color, there occurs no parasitic capacitance between the second data line DL2 and the anode 171 of the third sub-pixel SP3, and thus no interference is caused between the second data line DL2 and the anode 171 of the third sub-pixel SP3. In detail, when the OLED device 100 displays a color represented by the first sub-pixel SP1 or the second sub-pixel SP2 and when the OLED device 100 displays the color represented by the third sub-pixel SP3, the second data line DL2 supplies a DC data voltage instead of an AC voltage. Therefore, an additional line for suppressing the parasitic capacitance that may occur between the second data line DL2 and the anode 171 of the third sub-pixel SP3 is not essential.

In view of the above, in the OLED device 100 according to an embodiment of the present disclosure, a second line L2 is disposed that overlaps with the second voltage supply line VDD2 for applying a high-potential voltage to the third sub-pixel SP3 and is electrically connected to the second voltage supply line VDD2. In detail, the second line L2 overlaps with the second voltage supply line VDD2 between the first planarization layer 114 and the second planarization layer 115. The second line L2 may be formed of a conductive metal such as molybdenum (Mo), aluminum (Al), chromium (Cr), gold (Au), titanium (Ti), nickel (Ni), neodymium (Nd) and copper (Cu), or an alloy of the two or more thereof, or multiple layers thereof. In addition, the second line L2 may be made of the same material as the connection electrode CE and the first line L1.

The second line L2 is electrically connected to the second voltage supply line VDD2 through the contact hole in the first planarization layer 114. In detail, as shown in FIG. 2A, the second line L2 maybe electrically connected to the second voltage supply line VDD2 by way of bring it into contact with the second voltage supply line VDD2 through a plurality of contact holes in the display area DA. The plurality of contact holes may be formed in every third sub-pixel SP3 or may be formed in some of the third sub-pixels SP3 at a regular interval.

As the second line L2 is electrically connected to the second voltage supply line VDD2 through the plurality of contact holes in the display area DA, the second line L2 is connected to the second voltage supply line VDD2 in parallel in the display area DA. Therefore, it is possible to reduce the voltage drop that may occur on the second voltage supply line VDD2 as compared with the sub-pixel with the second voltage supply line VDD2 alone. That is, as the second line L2 is connected to the second voltage supply line VDD2 in parallel in the display area DA via the plurality of contact holes, the resistance of the line transferring the high-potential voltage can be reduced compared with the sub-pixel where a high-potential voltage is transferred via a single line. As a result, the voltage drop of the high-potential voltage transferred through the second line L2 and the second voltage supply line VDD2 is reduced, such that the power consumption of the OLED device 100 can be improved, and the luminance uniformity over the central portion and the peripheral portion of the OLED device 100 can be improved.

The OLED device 100 according to the embodiment of the present disclosure can provide a space for an additional line by using the first planarization layer 114 and the second planarization layer 115. Accordingly, in the OLED device 100 according to an embodiment of the present disclosure, an additional line may be disposed selectively in the plurality of sub-pixels SP1, SP2 and SP3, taking into account the connective relationship between the data lines DL1 and DL2 and the plurality of sub-pixels SP1, SP2 and SP3, to prevent performance deterioration of the OLED device 100.

In detail, the first line L1 may be disposed between the first data line DL1 for supplying a data voltage to the first sub-pixel SP1 and the second sub-pixel SP2 emitting light of different colors and the anode 171 of the first sub-pixel SP1 or the second sub-pixel SP2. As a result, it is possible to suppress interference between the first data line DL1 and the anode 171 of the first sub-pixel SP1 or the second sub-pixel SP2. In addition, since the second data line DL2 supplies the data voltage only to the third sub-pixel SP3, no additional line is disposed between the second data line DL2 and the anode 171 of the third sub-pixel SP3 in the third sub-pixel SP3. Instead, the second line L2 may be disposed to reduce the resistance of the second voltage supply line VDD2 for supplying a high-potential voltage to the third sub-pixel SP3. That is, in the OLED device 100 according to an embodiment of the present disclosure, in order to solve color change and luminance variation that possibly occur as data voltage is applied to sub-pixels emitting light of different colors via a single data line, the first line L1 is disposed such that it overlaps with the first data line DL1 in the first and second sub-pixels SP1 and SP2. In addition, when a data voltage is supplied to a sub-pixel emitting light of the same color via a single data line, in order to reduce a voltage drop on the second voltage supply line VDD2 for supplying a high-potential voltage to the sub-pixel, the second line L2 is connected to the second voltage supply line VDD2 in parallel through the contact hole in the third sub-pixel SP3. As described above, in the OLED device 100 according to an embodiment of the present disclosure, the arrangement and connection of the additional lines disposed on the first planarization layer 114 are determined based on the type of the voltage supplied by the data lines DL1 and DL2, and on whether the data lines DL1 and DL2 overlap with the anode 171, etc., such that various performances of the OLED device 100 as described above can be improved.

In addition, in the OLED device 100 according to an embodiment of the present disclosure, the first line L1 and the second line L2 are disposed on the first planarization layer 114 such that the second line L2 is connected to the second voltage supply line VDD2 in the display area DATA while the first line L1 is connected to the first voltage supply line in the non-display area NA. Therefore, in the display area DA, a contact hole for connecting the first line L1 with another line is not required in the first planarization layer 114. The first planarization layer 114 has to provide a flat surface over the thin-film transistor 160. And, if there are too many contact holes in the first planarization layer 114, the first planarization layer 114 may fail to provide a flat surface due to the contact holes. And, since there is a process margin in the process of forming the contact holes in the first planarization layer 114, it may be difficult to form too many contact holes in the first planarization layer 114. In view of the above, in the OLED device 100 according to an embodiment of the present disclosure, the first line L1 and the second line L2 are disposed on the first planarization layer 114 such that the second line L2 is connected to the second voltage supply line in the display area DA while the first line L1 is not connected to another line in the display area DATA. Accordingly, the first planarization layer 114 can provide a flat surface, and the process for forming the contact holes in the first planarization layer 114 can be easily performed.

Figure 3A:
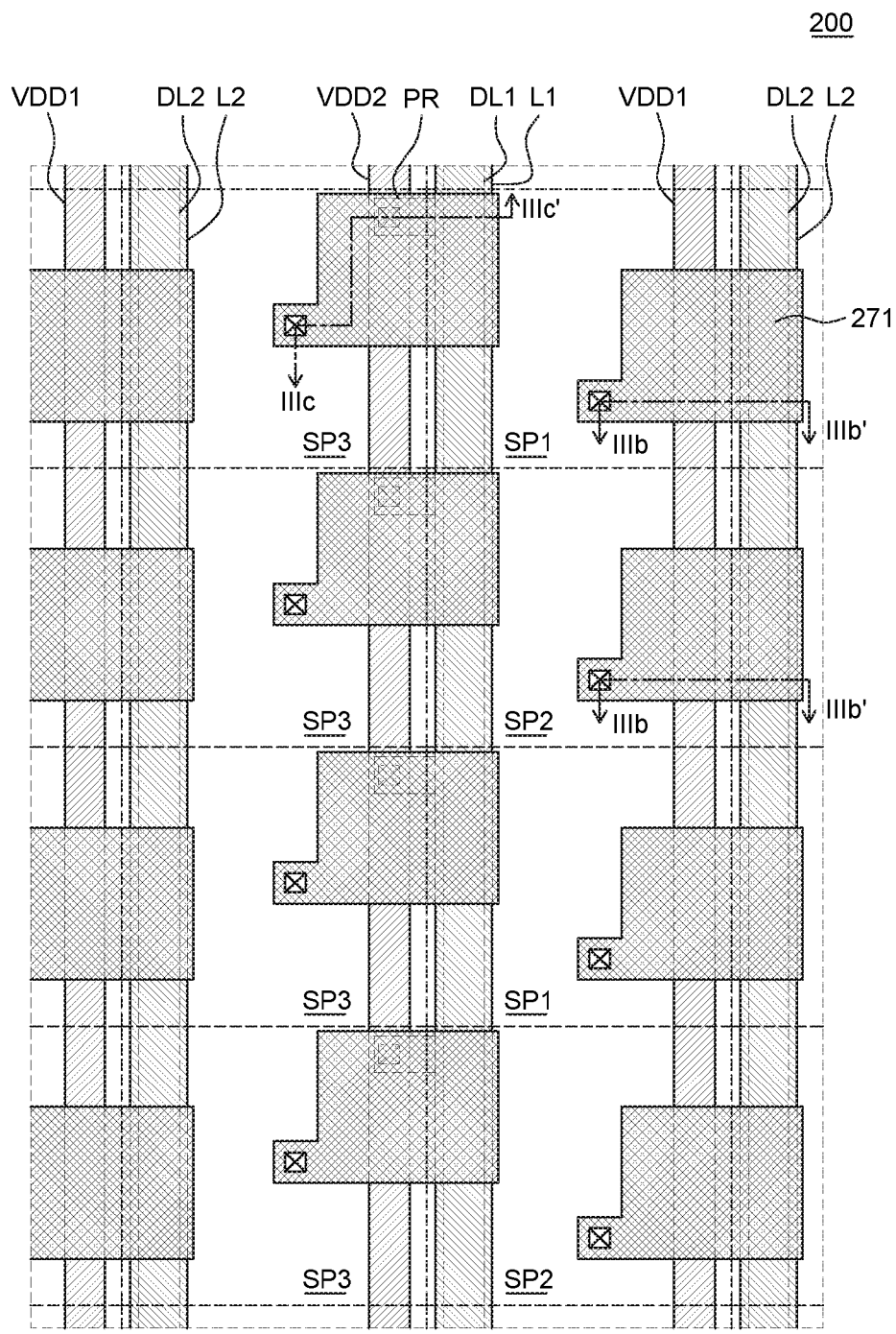
FIG. 3A is a schematic plan view of an OLED device according to another embodiment of the present disclosure.
Figure 3B:
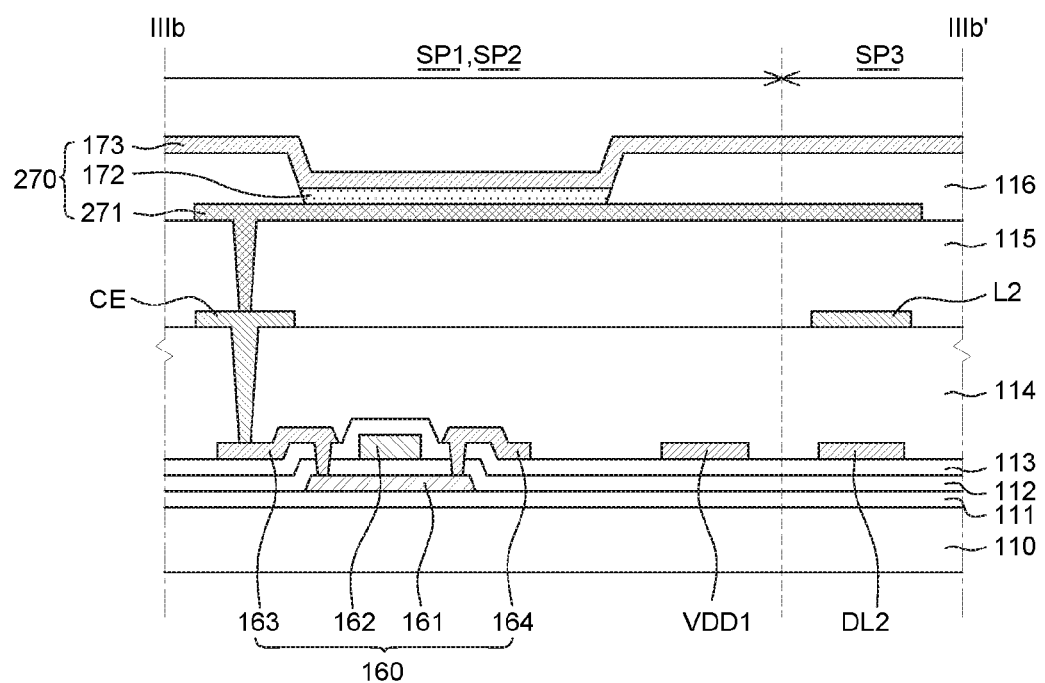
FIG. 3B is a cross-sectional view taken along line IIIb-IIIb' of FIG. 3A.
Figure 3C:
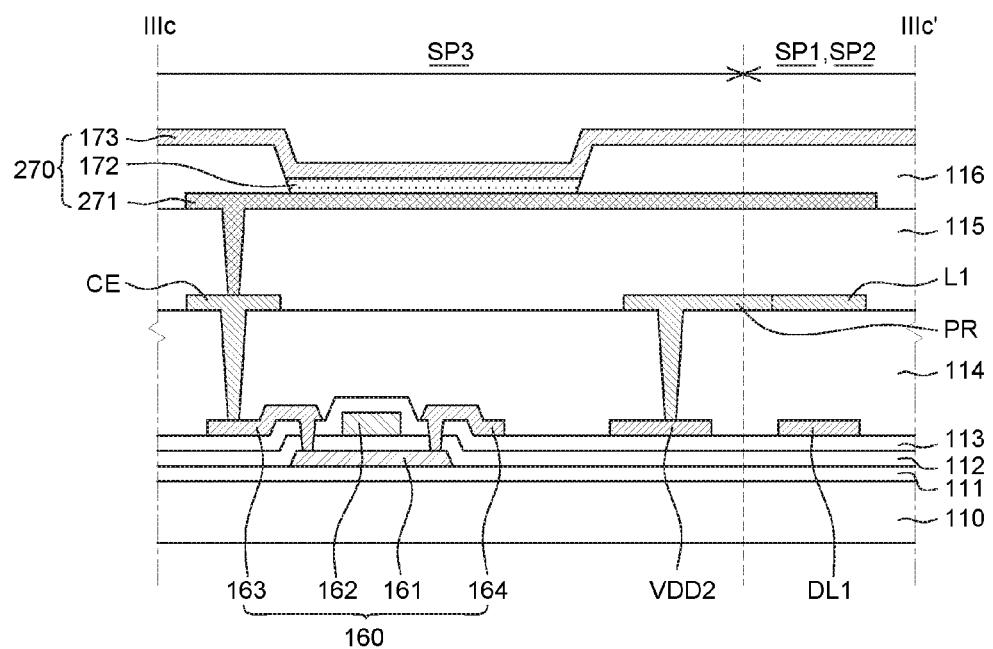
FIG. 3C is a cross-sectional view taken along line IIIc-IIIc' of FIG. 3A.

FIG. 5A is a schematic plan view of an OLED device according to another embodiment of the present disclosure. FIG. 3B is a cross-sectional view taken along line IIIb-IIIb' of FIG. 3A. FIG. 3C is a cross-sectional view taken along line IIIc-IIIc' of FIG. 3A. An OLED device 200 shown in FIGS. 3A to 3C is substantially identical to the OLED device 100 shown in FIGS. 2A to 2C, except for the arrangement and connection of an anode 171 of an organic light-emitting element 170, a first line L1 and a second line L2, and, therefore, the redundant description will be omitted. In FIGS. 3B and 3C, the first sub-pixel SP1 and the second sub-pixel SP2 have substantially the same cross-sectional structure, and thus the cross-sectional structure of the first sub-pixel SP1 and the second sub-pixel SP2 will be described together.

Referring to FIG. 3A, the anode 271 of the organic light-emitting element 270 may overlap with at least one of various lines such as a first data line DL1, a second data line DL2, a first voltage supply line VDD1 and a second voltage supply line VDD2. In FIG. 3A, the anode 271 of the first sub-pixel SP1 and the anode 271 of the second sub-pixel SP2 overlap with the second data line DL2, while the anode 271 of the third sub-pixel SP3 overlaps with the first data line DL1.

As mentioned earlier, since the first sub-pixel SP1 and the second sub-pixel SP2 emitting light of different colors receive the data voltage from the first data line DL1, there may occur interference between the first data line DL1 and the anode 271 overlapping with the first data line DL1. To avoid this, in the OLED device 200 according to another embodiment of the present disclosure, the first line L1 is disposed between the first data line DL1 and the anode 271 overlapping with the first data line DL1, among the anodes 271 of the plurality of sub-pixels SP1, SP2 and SP3. Hereinafter, the cross-sectional structure of the OLED device 200 will be described in detail below with reference to FIGS. 3B and 3C.

Referring to FIGS. 3B and 3C, in the first sub-pixel SP1 and the second sub-pixel SP2, the first data line DL1 and the first voltage supply line VDD1 are disposed on an interlayer insulating layer 113. The first data line DL1 is for supplying a data voltage to the first sub-pixel SP1 and the second sub-pixel SP2. The first voltage supply line VDD1 is for supplying a high-potential voltage to the first sub-pixel SP1 and the second sub-pixels SP2. The high-potential voltage supplied through the first voltage supply line VDD1 may be a constant voltage, which may have a fixed value.

Referring to FIGS. 3B and 3C, in the third sub-pixel SP3, the second data line DL2 and the second voltage supply line VDD2 are disposed on the interlayer insulating layer 113. The second data line DL2 is a line for supplying a data voltage to the third sub pixel SP3, while the second voltage supply line VDD2 is a line for supplying a high-potential voltage to the third sub-pixel SP3. The high-potential voltage supplied through the second voltage supply line VDD2 may be a constant voltage, which may have a fixed value. The constant voltage supplied through the second voltage supply line VDD2 may be the same voltage as the constant voltage supplied through the first voltage supply line VDD1. Accordingly, the first voltage supply line VDD1 and the second voltage supply line VDD2 maybe electrically connected to each other in the non-display area NA.

Referring to FIG. 3C, the anode 271 of the third sub-pixel SP3 overlaps with the first data line DL1. As described above, when the OLED device 200 displays a single color, especially the color represented by the first sub-pixel SP1 or the second sub-pixel SP2, the first data line DL1 alternately supplies voltage for turning on the first sub-pixel SP1 or the second sub-pixel SP2 and voltage for turning off the other one. Accordingly, the data voltage applied through the first data line DL1 may be an AC voltage. As AC data voltage is applied, parasitic capacitance may be generated between the first data line DL1 and the anode 271 of the third sub-pixel SP3, such that interference may be caused. As a result, the third sub-pixel SP3 may not be turned off but operate to display an unwanted color, such that color change or luminance variation may take place.

To avoid this, in the OLED device 200 according to an embodiment of the present disclosure, the first line L1 is disposed between the first data line DL1 via which the data voltage is applied to the sub-pixels emitting light of different colors, that is, the first sub-pixel SP1 and the second sub-pixel SP2, and the anode 271 of the third sub-pixel SP3 overlapping the first data line DL1.

A constant voltage may be applied to the first line L1. As described above, in order to reduce the parasitic capacitance between the first data line DL1 and the anode 271 of the third sub-pixel SP3, which may occur as the AC data voltage is applied as the first data voltage, the constant voltage may be applied to the first line L1. The constant voltage applied to the first line L1 may be the same as the high-potential voltage applied through the second voltage supply line VDD2. Accordingly, the first line L1 may be electrically connected to the first voltage supply line VDD1 in the non-display area NA outside the display area DA.

In addition, the first line L1 may be electrically connected to the second voltage supply line VDD2 through a plurality of contact holes in the first planarization layer 114 in the display area DA. In detail, referring to FIGS. 3A and 3C, the first line L1 may include a plurality of protrusions PR protruding to overlap with the second voltage supply line VDD2. Each of the plurality of protrusions PR may be in contact with the second voltage supply line VDD2 through the respective contact holes in the first planarization layer 114 on the second voltage supply line VDD2. The plurality of contact holes maybe formed in every third sub-pixel SP3 or may be formed in some of the third sub-pixels SP3 at a regular interval. The plurality of protrusions PR may be formed with the same material as the first line L1 simultaneously with them.

As the first line L1 is electrically connected to the second voltage supply line VDD2 through the plurality of contact holes in the display area DA, the first line L1 may be connected to the second voltage supply line VDD2 in parallel in the display area DA. As a result, the voltage drop of the high-potential voltage transferred through the first line L1 and the second voltage supply line VDD2 is reduced, such that the power consumption of the OLED device 200 can be improved, and the luminance uniformity over the central portion and the peripheral portion of the OLED device 200 can be improved.

Referring to FIG. 3B, the anode 271 of the first sub-pixel SP1 and the second sub-pixel SP2 overlaps with the second data line DL2. Since the second data line DL2 is used to apply the data voltage only to the third sub-pixel SP3, when the OLED device 200 displays a single color, there occurs no parasitic capacitance between the second data line DL2 and the anode 271 of the first sub-pixel SP1 and the second sub-pixel SP2, and thus no interference is caused between the second data line DL2 and the anode 271 of the first sub-pixel SP1 and the second sub-pixel SP2. In detail, when the OLED device 200 displays a color represented by the first sub-pixel SP1 or the second sub-pixel SP2 and when the OLED device 200 displays the color represented by the third sub-pixel SP3, the second data line DL2 supplies a DC data voltage instead of an AC data voltage. Therefore, an additional line for suppressing the parasitic capacitance that may occur between the second data line DL2 and the anode 271 of the first sub-pixel SP1 and the second sub-pixel SP2 is not essential.

In view of the above, in the OLED device 200 according to an embodiment of the present disclosure, a second line L2 disposed on the first planarization layer 114 may overlap with the first voltage supply line VDD1 or the second data line DL2 above the first voltage supply line VDD1 or the second data line DL2, respectively. It is to be noted that the third sub-pixel SP3 to which data voltage is applied through the second data line DL2 emits light of a color different from the colors of the light emitted from the first sub-pixel SP1 and the second sub-pixel SP2 overlapping with the second data line DL2. Accordingly, as shown in FIG. 3B, in order to suppress interference between the second data line DL2 and the anode 271 of the first sub-pixel SP1 or the second sub-pixel SP2, the second line L2 may be disposed between the second data line DL2 and the anode 271 of the first sub-pixel SP1 or the second sub-pixel SP2. However, the location of the second line L2 is not limited thereto.

A constant voltage may be applied to the second line L2. That is, in order to reduce interference between the second data line DL2 and the anode 271 of the first sub-pixel SP1 and the second sub-pixel SP2, the constant voltage may be applied to the second line L2. The constant voltage applied to the second line L2 may be the same as the high-potential voltage applied through the first voltage supply line VDD1. Accordingly, the second line L2 may be electrically connected to the first voltage supply line VDD1 in the non-display area NA outside the display area DA.

In some embodiments, the second line L2 may also be electrically connected to the first voltage supply line VDD1 through the plurality of contact holes in the display area DA. When the second line L2 overlaps with the first voltage supply line VDD1, the second line L2 may come in direct contact with the first voltage supply line VDD1 through the plurality of contact holes to be electrically connected to the first voltage supply line VDD1. When the second line L2 overlaps with the second data line DL2 as shown in FIG. 3B, the second line L2 may include a plurality of protrusions that protrudes to overlap with the first voltage supply line VDD1. In detail, the second line L2 may be electrically connected to the first voltage supply line VDD1 by a plurality of protrusions that is in contact with the first voltage supply line VDD1 through the plurality of contact holes in the first planarization layer 114 above the first voltage supply line VDD1.

Figure 4A:
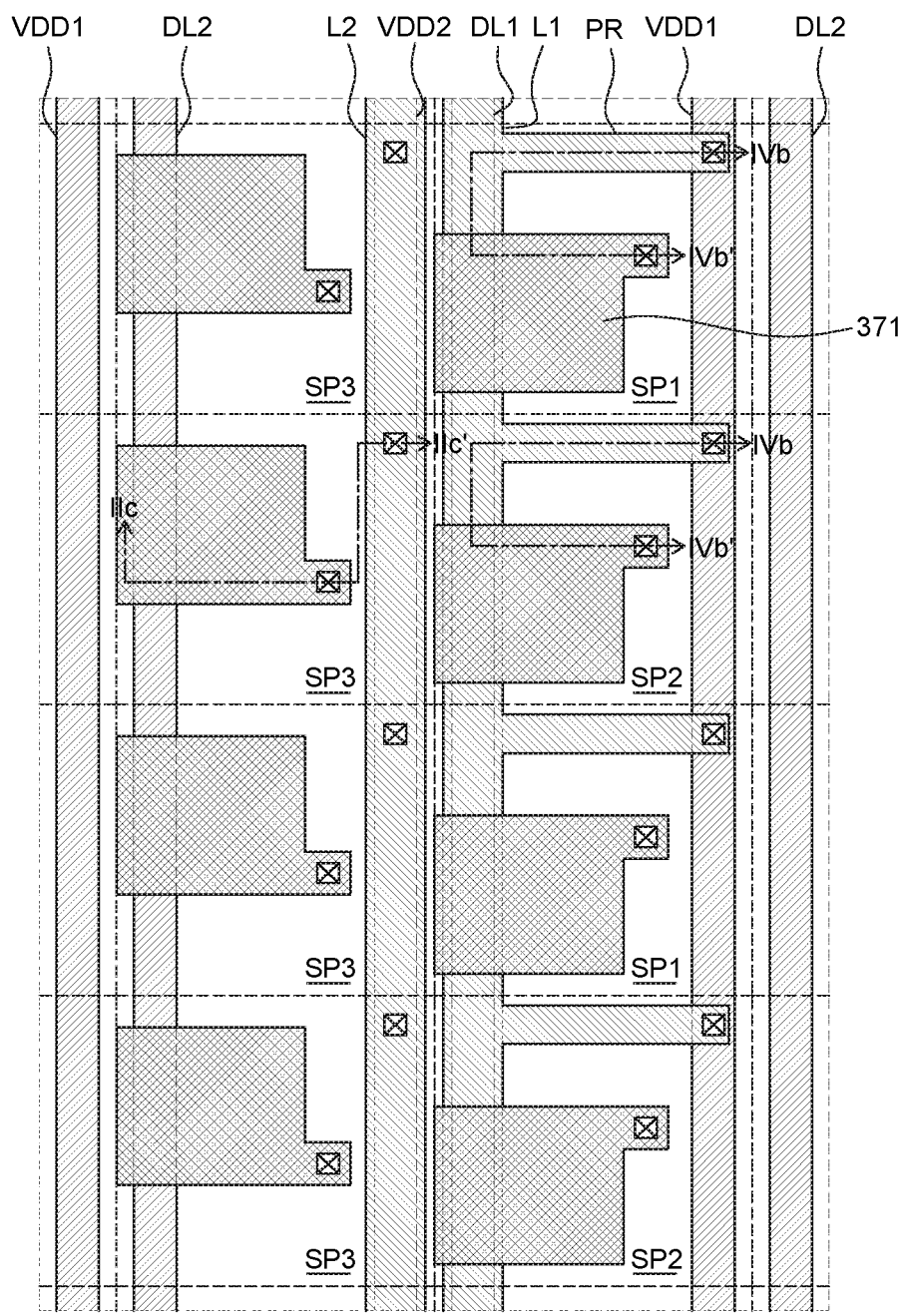
FIG. 4A is a schematic plan view of an OLED device according to yet another embodiment of the present disclosure.
Figure 4B:
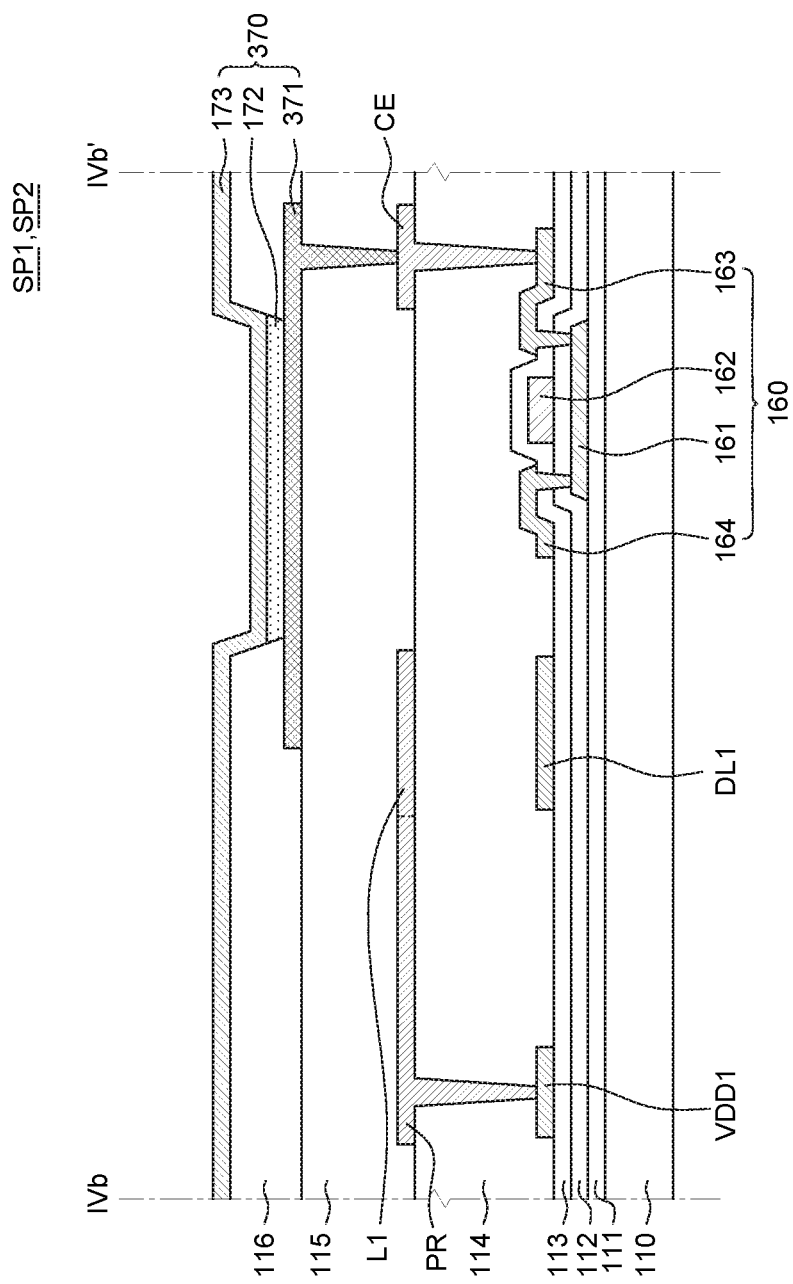
FIG. 4B is a cross-sectional view taken along line IVb-IVb' of FIG. 4A.

FIG. 4A is a schematic plan view of an OLED device according to yet another embodiment of the present disclosure. FIG. 4B is a cross-sectional view taken along line IVb-IVb' of FIG. 4A. An OLED device 300 shown in FIGS. 4A to 4C is substantially identical to the OLED device 200 shown in FIGS. 2A to 2C, except for the first line L1 and the first voltage supply line VDD1, and, therefore, the redundant description will be omitted. In addition, the cross sectional structure of the third sub-pixel SP3 in FIG. 4A, that is, the cross sectional structure taken along line IIc-IIc' is substantially identical to the cross sectional structure of the third sub-pixel SP3 shown in FIG. 2C; and, therefore, the redundant description will be omitted. In FIG. 4B, the first sub-pixel SP1 and the second sub-pixel SP2 have substantially the same cross-sectional structure, and thus the cross-sectional structure of the first sub-pixel SP1 and the second sub-pixel SP2 will be described together.

Referring to FIGS. 4A and 4B, an anode 371 of the first sub-pixel SP1 and the second sub-pixel SP2 overlaps with the first data line DL1. To avoid this, in the OLED device 300 according to an embodiment of the present disclosure, the first line L1 is disposed between the first data line DL1 via which the data voltage is applied to the sub-pixels emitting light of different colors, that is, the first sub-pixel SP1 and the second sub-pixel SP2, and the anode 371 of the first sub-pixel SP1 and the second sub-pixel SP2 overlapping the first data line DL1. As a result, color change or luminance variation can be suppressed in the OLED device 300 according to this embodiment of the present disclosure.

A constant voltage may be applied to the first line L1. In order to reduce the parasitic capacitance between the first data line DL1 and the anode 371 of the first sub-pixel SP1 and the second sub-pixel SP2, which may occur as the AC data voltage is applied as the first data voltage, the constant voltage may be applied to the first line L1. The constant voltage applied to the first line L1 may be the same as the high-potential voltage applied through the first voltage supply line VDD1. Accordingly, the first line L1 may be electrically connected to the first voltage supply line VDD1 in the non-display area NA outside the display area DA. In addition, the first line L1 may be electrically connected to the first voltage supply line VDD1 through a plurality of contact holes in the first planarization layer 114 in the display area DA. In detail, referring to FIGS. 4A and 4B, the first line L1 may include a plurality of protrusions PR protruding to overlap with the first voltage supply line VDD1. Each of the plurality of protrusions PR may be in contact with the first voltage supply line VDD1 through the respective contact holes in the first planarization layer 114 on the first voltage supply line VDD1. The plurality of contact holes may be formed in every first sub-pixel SP1 and every second sub-pixel SP2 or may be formed in some of the first sub-pixels SP1 and the second sub-pixels SP2 at a regular interval. The plurality of protrusions PR may be formed with the same material as the first line L1 simultaneously with them.

As the first line L1 is electrically connected to the first voltage supply line VDD1 through the plurality of contact holes in the display area DA, the first line L1 may be connected to the first voltage supply line VDD1 in parallel in the display area DA. As a result, the voltage drop of the high-potential voltage transferred through the first line L1 and the first voltage supply line VDD1 is reduced, such that the power consumption of the OLED device 300 can be improved, and the luminance uniformity over the central portion and the peripheral portion of the OLED device 300 can be improved.

In addition, in the embodiments shown in FIGS. 2A to 4B, the first line L1 may be disposed on the first planarization layer 114 such that it overlaps the first data line DL1. That is, by applying high-potential voltage to the first line L1 so that the first line L1 works as the first voltage supply line VDD1, it is possible to eliminate the first voltage supply line VDD1 disposed on the interlayer insulating layer 113, thereby reducing the space occupied by the first voltage supply line VDD1. In this manner, high definition of the pixel can be achieved, and the design space for the driving elements can be obtained.

Figure 5:
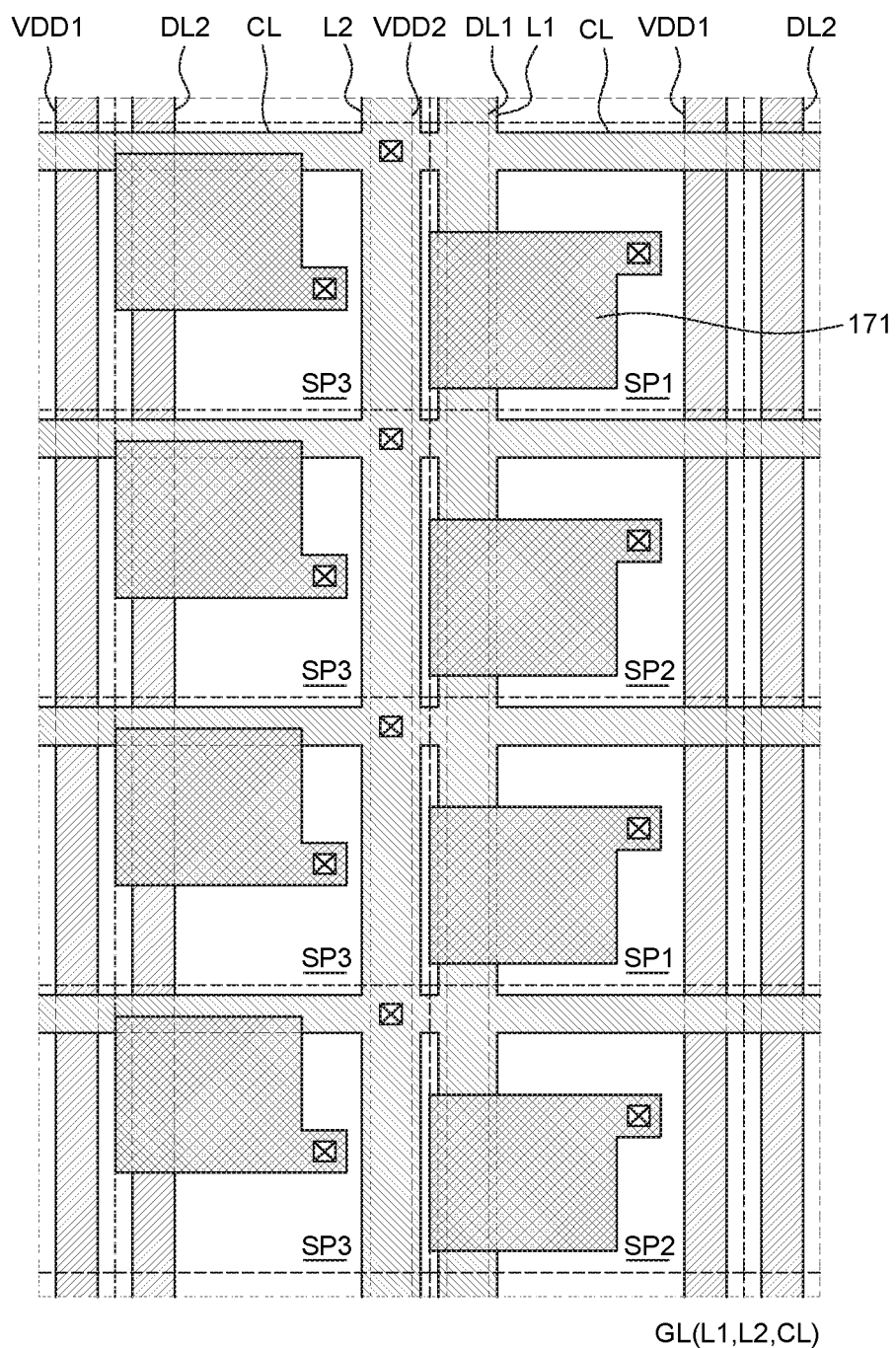
FIGS. 5 to 7 are schematic plan views of OLED devices according to embodiments of the present disclosure.
Figure 6:
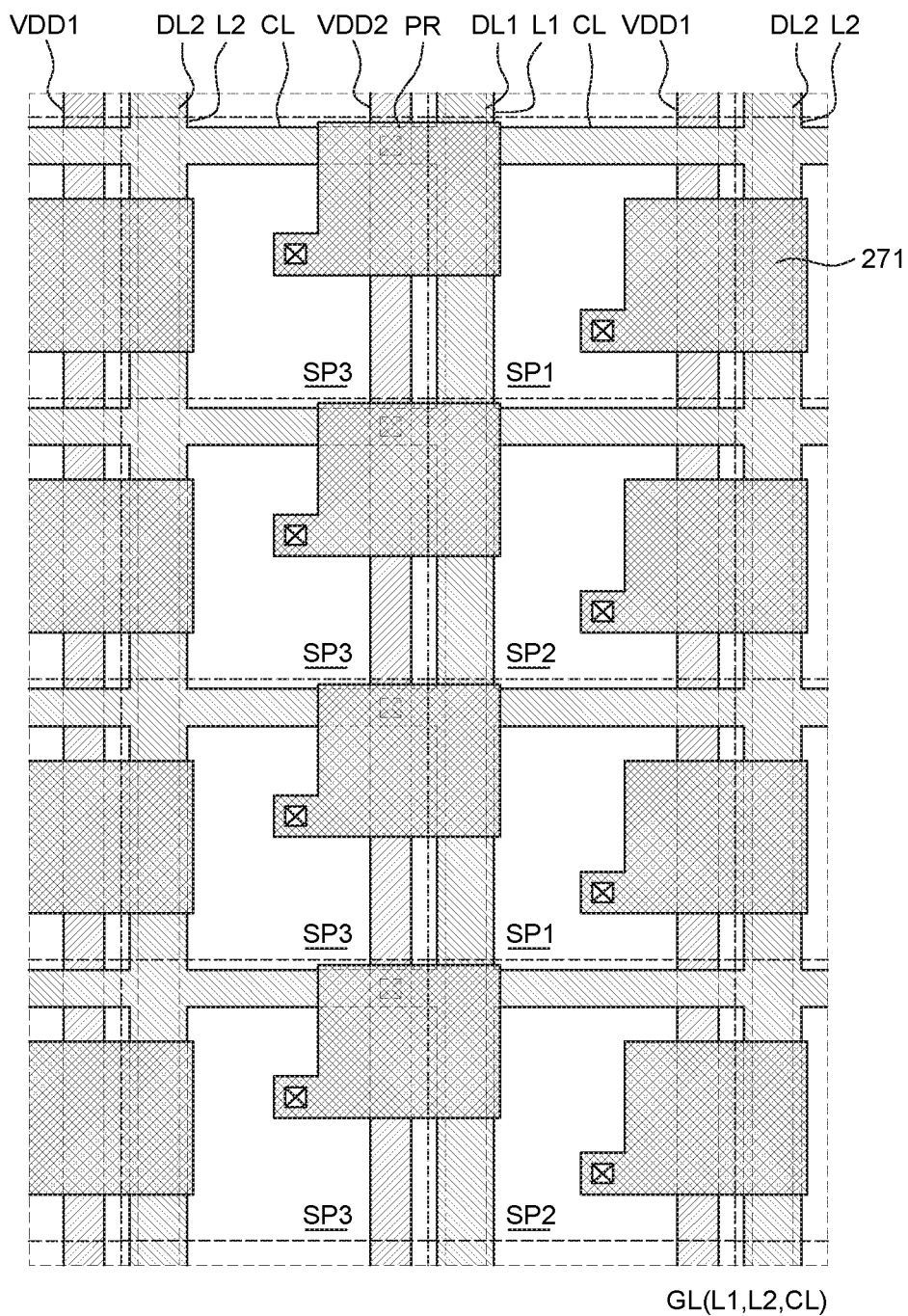
Figure 7:
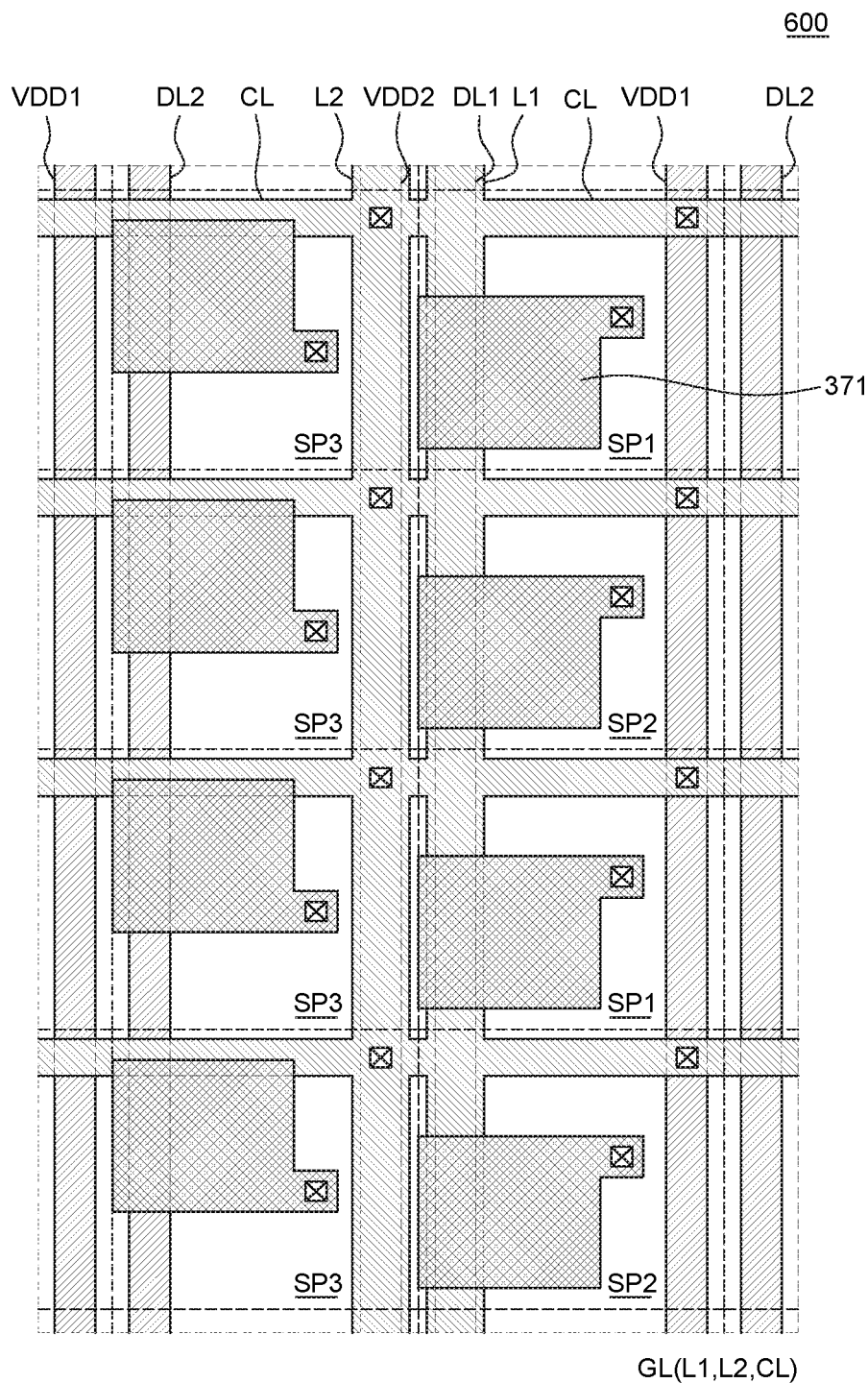

FIGS. 5 to 7 are schematic plan views of OLED devices according to embodiments of the present disclosure. An OLED device 400 shown in FIG. 5 is substantially identical to the OLED device 100 shown in FIGS. 2A to 2C except for a connection line CL; and, therefore, the redundant description will not be made. An OLED device 500 shown in FIG. 6 is substantially identical to the OLED device 200 shown in FIGS. 3A to 3C except for a connection line CL; and, therefore, the redundant description will not be made. An OLED device 600 shown in FIG. 7 is substantially identical to the OLED device 300 shown in FIGS. 4A and 4B except for a connection line CL; and, therefore, the redundant description will not be made.

Referring to FIGS. 5 to 7, the connection line CL electrically connects the first line L1 with the second line L2. The connection line CL intersects the first line L1 and the second line L2 on the same plane. That is, the connection line CL may be formed with the same material as the first line L1 and the second line L2 simultaneously with them. Thus, the connection line CL, the first line L1 and the second line L2 may be formed as a single piece on the first planarization layer 114 and have the same potential.

Referring to FIGS. 5 to 7, the connection line CL forms a grid line GL together with the first line L1 and the second line L2. The grid line GL is composed of the connection line CL extending in the horizontal direction and the first line L1 and the second line L2 extending in the vertical direction of FIGS. 5 to 7 to form a grid pattern.

As the connection line CL, the first line L1 and the second line L2 are connected to each other to form the grid line GL, the voltage drop in the second voltage supply line VDD2 can be reduced. In detail, by additionally disposing the connection line CL, the first line L1, the second line L2 and the connection line CL in a grid pattern can provide the equal potential in the display area DA, and thus the resistance of the line for transferring a high-potential voltage to the sub-pixel SP3 can be reduced as compared with the sub-pixel without the grid line GL. As a result, the voltage drop of the high-potential voltage transferred through the second voltage supply line VDD2 can be reduced. In addition, since the second voltage supply line VDD2 and the first voltage supply line VDD1 may be electrically connected to each other in the non-display area NA, the voltage drop of the high-potential voltage transferred through the first voltage supply line VDD1 can also be reduced. In particular, in the OLED device 600 shown in FIG. 7, since the grid line GL may be electrically connected to the first voltage supply line VDD1 through the plurality of contact holes in the display area DA, the voltage drop of the high-potential voltage transferred through the first voltage supply line VDD1 and the second voltage supply line VDD2 can also be reduced. As a result, the power consumption of the OLED devices 400, 500 and 600 can be improved more effectively, and the luminance uniformity in the central region and the edge region of the OLED devices 400, 500 and 600.

In addition, as the first line L1 is connected to the second line L2 through the connection line CL, the first line can reduce the interference between the first data line DL1 and the anodes 171, 271 and 371. As mentioned earlier, in order to reduce the interference between the first data line DL1 and the anodes 171, 271 and 371, a constant voltage is applied to the first line L1 disposed between the first data line DL1 and the anodes 171, 271 and 371. In doing so, as shown in FIGS. 5 to 7, the first line L1, the connection line CL and the second line L2 form the grid line GL, and the grid line GL is electrically connected to the second voltage supply line VDD2 and the first voltage supply line VDD1 through the plurality of contact holes in the display area DA, such that the constant voltage can be provided to the first line L1 more stably. As a result, the interference resulted from parasitic capacitance occurring between the first data line DL1 and the anodes 171, 271 and 371 can be reduced more effectively.

Figure 8:
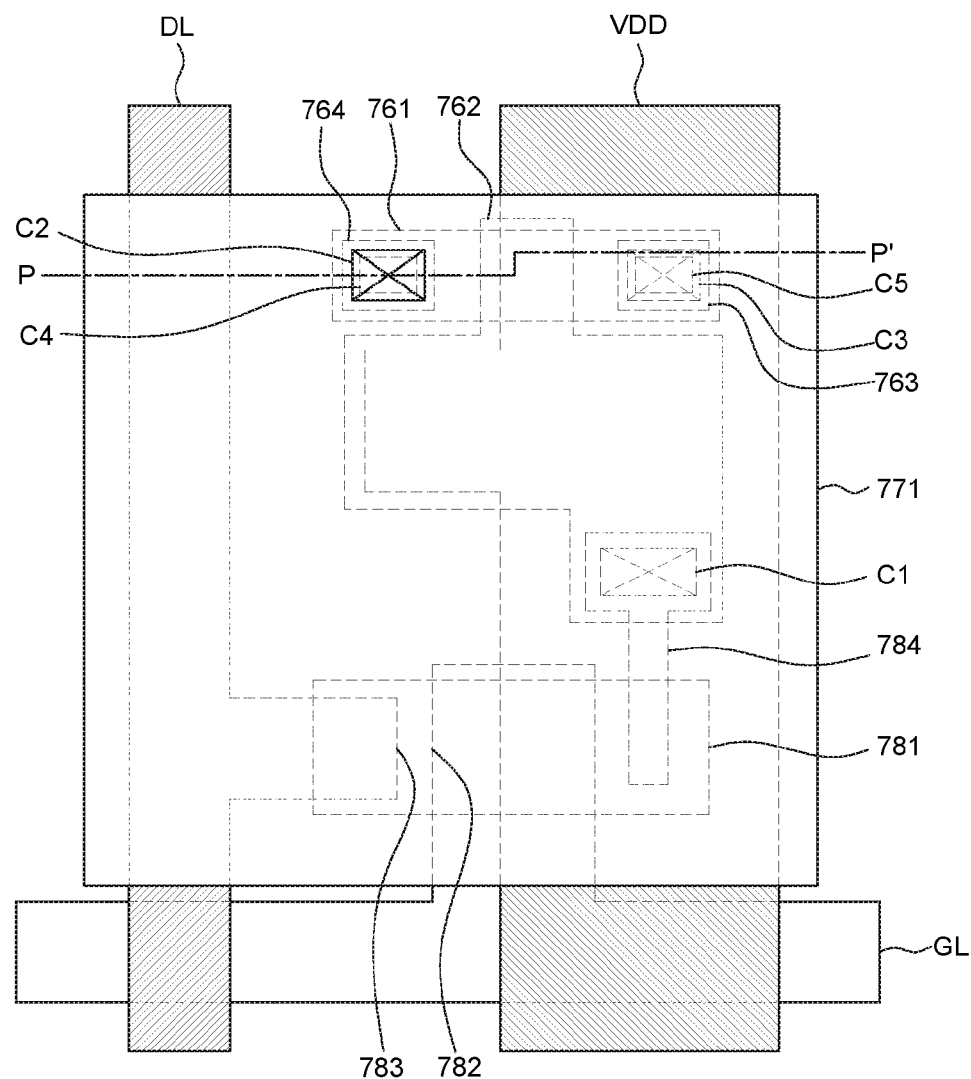
FIG. 8 is a schematic plan view of an OLED device according to still another embodiment of the present disclosure.

FIG. 8 is a schematic plan view of an OLED device according to still another embodiment of the present disclosure. An OLED device 700 shown in FIG. 8 is substantially identical to the OLED device 100 shown in FIGS. 1 to 2C except for that the data line DL, the gate line GL and the voltage supply line VDD are different and that the driving elements are depicted explicitly, and, therefore, the redundant description will not be made.

The OLED device 700 may include a plurality of pixels, and each of the pixels may include a plurality of sub-pixels. The sub-pixel is a minimum unit for representing a color. In FIG. 8, a sub-pixel among the plurality of sub-pixels of the OLED device 700 is schematically depicted.

The sub-pixel may include transistors, a capacitor, and lines. The sub-pixel shown in FIG. 8 maybe of a 2T1C type including two transistors and one capacitor, but this is not limiting. The sub-pixel may be of 4T1C, 7T1C or 6T2C type, for example. In addition, the sub-pixel shown in FIG. 8 has been implemented so that it is applicable to a top-emission OLED device.

The plurality of lines may include the gate line GL, the data line DL, and a voltage supply line VDD. In addition, the plurality of transistors may include a scan transistor 780 and a driving transistor 760.

The scan transistor 780 includes a gate electrode 782 that receives a gate signal input from the gate line GL, an active layer 781, a source electrode 783 that receives a data signal from the data line DL, and a drain electrode 784.

The driving transistor 760 includes a gate electrode 762 connected to the drain electrode 784 of the scan transistor 780 through a first contact hole C1, an active layer 761, a drain electrode 764 connected to the active layer 761 through a second contact hole C2, and a source electrode 763 connected to the active layer 761 through a third contact hole C3. The drain electrode 764 is connected to the anode 771 through a fourth contact hole C4, and the source electrode 763 is connected to the voltage supply line VDD through a fifth contact hole C5.

The configurations of the driving transistor 760 and the scan transistor 780 shown in FIG. 8 are substantially identical to the configuration of the thin-film transistor 160 shown in FIG. 2B; and, therefore, the redundant description will be omitted.

An electrode of the capacitor is formed as a part of the voltage supply line VDD, and the other electrode of the capacitor is formed as an extended part of the gate electrode 762 of the driving transistor 760 overlapping with one electrode of the capacitor, which is connected to the drain electrode 784 of the scan transistor 780.

The voltage supply line VDD overlaps with a part of each of the drain electrode 784, the gate electrode 782 and the active layer 781 of the scan transistor 780, and overlaps with each of the source electrode 763, the gate electrode 762 and the active layer 761. By disposing the voltage supply line VDD such that it overlaps with other driving elements, the space for the voltage supply line VDD in the sub-pixel can be reduced, thereby achieving high definition of the sub-pixel.

Since the width of the voltage supply line VDD may be changed in accordance with the resistance of the voltage supply line VDD, the area where the driving element overlaps with the voltage supply line VDD may also be changed. Accordingly, the area where the driving element overlaps with the voltage supply line VDD may also be changed depending on the location of the driving elements disposed in the sub-pixel.

If the voltage supply line VDD has a high resistance, it may fail to apply the equal voltage to all the sub-pixels due to a voltage drop increasing toward the inside of the OLED device 700, such that the luminance of the OLED device 700 may become uneven. Accordingly, the voltage supply line VDD has to be designed to reduce its resistance.

The resistance of the voltage supply line VDD can be reduced by increasing the width of the voltage supply line VDD larger than the width of the data line DL or by using a metal having a low resistance to form the voltage supply line VDD. Alternatively, the resistance of the voltage supply line VDD can be reduced by appropriately determining the width of the voltage supply line VDD and selecting the kind of the metal forming the voltage supply line VDD. By reducing the resistance of the voltage supply line VDD as described above, the luminance uniformity of the sub-pixels can be improved and the power consumption of the OLED device 700 can be reduced.

In addition, by disposing the voltage supply line VDD such that it overlaps with the active layer 761 of the driving transistor 760 or the active layer 781 of the scan transistor 780 in order to increase the width of the voltage supply line VDD, it is also possible to block UV light used during the process from reaching the active layers 761 and 781. As a result, it is possible to avoid deterioration of the active layers 761 and 781 possibly occurring during the irradiation of the UV light.

In order to dispose the voltage supply line VDD such that it overlaps with a part of the driving elements such as the scan transistor 780, the driving transistor 760 and the capacitor, the driving elements may be covered with a planarization layer, and the voltage supply line VDD may be formed on the planarization layer. That is, since the voltage supply line VDD is formed on a different layer from the layer where the driving elements are disposed, the voltage supply line VDD can be insulated from the driving elements, such that the voltage supply line VDD and the driving elements can be overlapped with each other.

As the resolution of the OLED device 700 increases and the size of the display device as a mobile display device, a display device for a smart watch, etc. becomes smaller, the size of the sub-pixels becomes smaller and thus integration of the driving elements disposed in the sub-pixels increases. Such a problem can be solved by disposing the voltage supply line VDD such that it overlaps with the driving elements.

Figure 9:
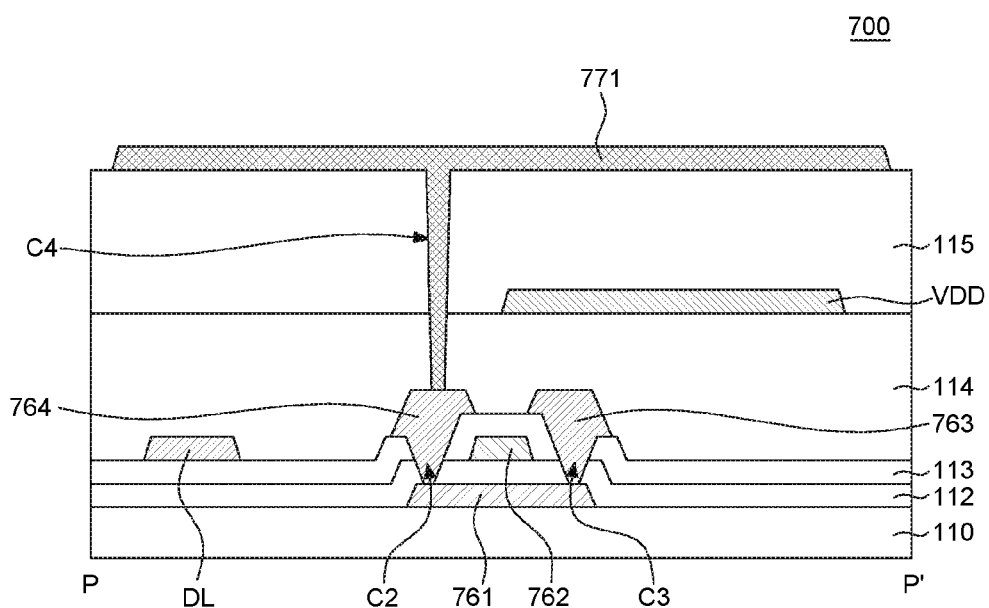
FIG. 9 is a cross-sectional view taken along line P-P' of FIG. 8.

FIG. 9 is a cross-sectional view taken along line P-P' of FIG. 8.

Referring to FIG. 9, the OLED device 700 includes a data line DL, a driving transistor 760, an anode 771 connected to a drain electrode 764 of the driving transistor 760, and a voltage supply line VDD.

An active layer 761 of the driving transistor 760 is disposed on the substrate 110, and a gate insulating layer 112 is disposed on the active layer 761, so that the gate insulating layer 112 insulates a gate electrode 762 from the active layer 761 disposed thereon.

An interlayer insulating layer 113 is disposed on the gate electrode 762. The active layer 761 of the driving transistor 760 is connected to the drain electrode 764 through the second contact hole C2 and to the source electrode 763 through the third contact hole C3 formed in the gate insulating layer 112 and the interlayer insulating layer 113. The data line DL is disposed on the same layer as the drain electrode 764 and the source electrode 763 disposed on the interlayer insulating layer 113. A first planarization layer 114 is disposed over the drain electrode 764, the source electrode 763 and the data line DL. Accordingly, the first planarization layer 114 can protect the driving transistor 760 and can reduce the level differences on the substrate 110 created by forming the driving transistor 760 and the data line DL.

Although not shown in FIG. 9, a protective layer for protecting the driving transistor 760 may be further formed between the first planarization layer 114 and the driving transistor 760.

The voltage supply line VDD may be disposed on the first planarization layer 114 and may be formed of a conductive metal such as molybdenum (Mo), aluminum (Al), chromium (Cr), gold (Au), titanium (Ti), nickel (Ni), neodymium (Nd) and copper (Cu), or an alloy of the two or more thereof, or multiple layers thereof.

By disposing the voltage supply line VDD on the first planarization layer 114, it is possible to obtain a space that was occupied by the voltage supply line VDD, compared to the sub-pixel where the voltage supply line VDD is formed on the same layer as the data line DL. Accordingly, the design space of the driving elements can be increased. In addition, since there are no components such as transistors, capacitors, or other complicated lines on the same layer where the voltage supply line VDD is disposed, the width of the voltage supply line VDD can be freely changed. Thus, by increasing the width of the voltage supply line VDD, the resistance of the voltage supply line VDD can be reduced. And, by selecting a metal having low resistance among the various conductive metals as described above to form the voltage supply line VDD with it, the resistance of the voltage supply line VDD can be further reduced. Accordingly, the luminance uniformity of the sub-pixels of the OLED device 700 can be improved, and the power consumption can be reduced. At this time, the voltage supply line VDD may be made of the same material as the data line DL or a metal material having a lower resistance than that of the data line DL.

The second planarization layer 115 may be disposed on the voltage supply line VDD, and an anode 771 may be disposed on the second planarization layer 115. The anode 771 is substantially identical to the anode 171 shown in FIG. 2B; and, therefore, the redundant description will be omitted.

Since the area of the anode 771 is larger than the areas of the other electrodes or the lines, the voltage applied to the driving elements may fluctuate by the coupling effect occurring when the anode 771 affects the driving elements formed around it. In contrast, in the embodiment shown in FIG. 9, the anode 771 is disposed spaced apart from the driving elements, for example, the transistor by the distance equal to the sum of the thickness of the first planarization layer 114 and the thickness of the second planarization layer 115. Therefore, it is possible to suppress the coupling effect between the anode 771 and the transistor. The first planarization layer 114 and the second planarization layer 115 may have a thickness of approximately 2 μm.

In addition, since a constant voltage is applied to the voltage supply line VDD disposed between the first planarization layer 114 and the second planarization layer 115 and the voltage supply line VDD covers a part of the transistor between the transistor and the anode 771, the coupling effect between the anode 771 disposed on the second planarization layer 115 and the transistor can be reduced.

Since the anode 771 is disposed on the second planarization layer 115 having a flat upper surface, the anode 771 can maintain the flatness of the surface like the second planarization layer 115. If the anode 771 is not formed on the planarization layer but is formed conforming to the level differences created by the transistors or other lines, it cannot reflect light uniformly. Therefore, there may be a large color shift over viewing angles of the OLED device 700. That is, by disposing the anode 771 on the second planarization layer 115, the flatness of the anode 771 can be maintained to reduce the color shift over viewing angles of the OLED device 700.

In addition, if the anode 771 is formed on the same layer as the voltage supply line VDD, the first planarization layer 114 may be damaged during several etching steps of the processes of forming the anode 771 and the voltage supply line VDD. That is, it may be difficult to maintain the flatness of the surface of the first planarization layer 114. Therefore, by forming the anode 771 on the second planarization layer 115, the flatness of the anode 771 can be maintained.

Figure 10:
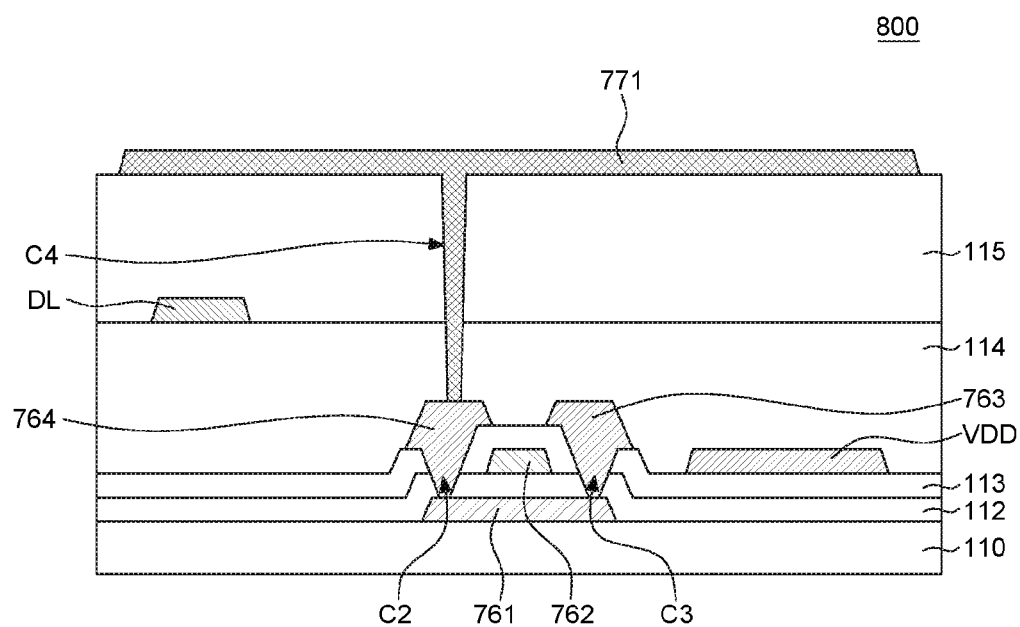
FIG. 10 is a cross-sectional view of an OLED device according to still another embodiment of the present disclosure.

FIG. 10 is a cross-sectional view of an OLED device according to still another embodiment of the present disclosure.

The locations of the data line DL and the voltage supply line VDD described above with reference to FIG. 9 are not limited to those shown in FIG. 9. The locations of the data line DL and the voltage supply line VDD may be changed as shown in FIG. 10. That is, the drain electrode 764 and the source electrode 763 of the driving transistor 760 and the voltage supply line VDD may be disposed on the interlayer insulating layer 113, and the data line DL may be disposed on the first planarization layer 114.

The voltage applied to the data line DL is continuously changed according to the data value to be displayed by the sub-pixel. Therefore, the voltage applied to the transistor may fluctuate due to the coupling effect of the driving elements formed around the data line DL, for example, the transistor and the data line DL. That is, by disposing the data line DL on the first planarization layer 114, the data line DL is spaced apart from the transistor by the distance equal to the thickness of the first planarization layer 114. Accordingly, it is possible to suppress the coupling effect between the data line DL and the transistor.

Figure 11:
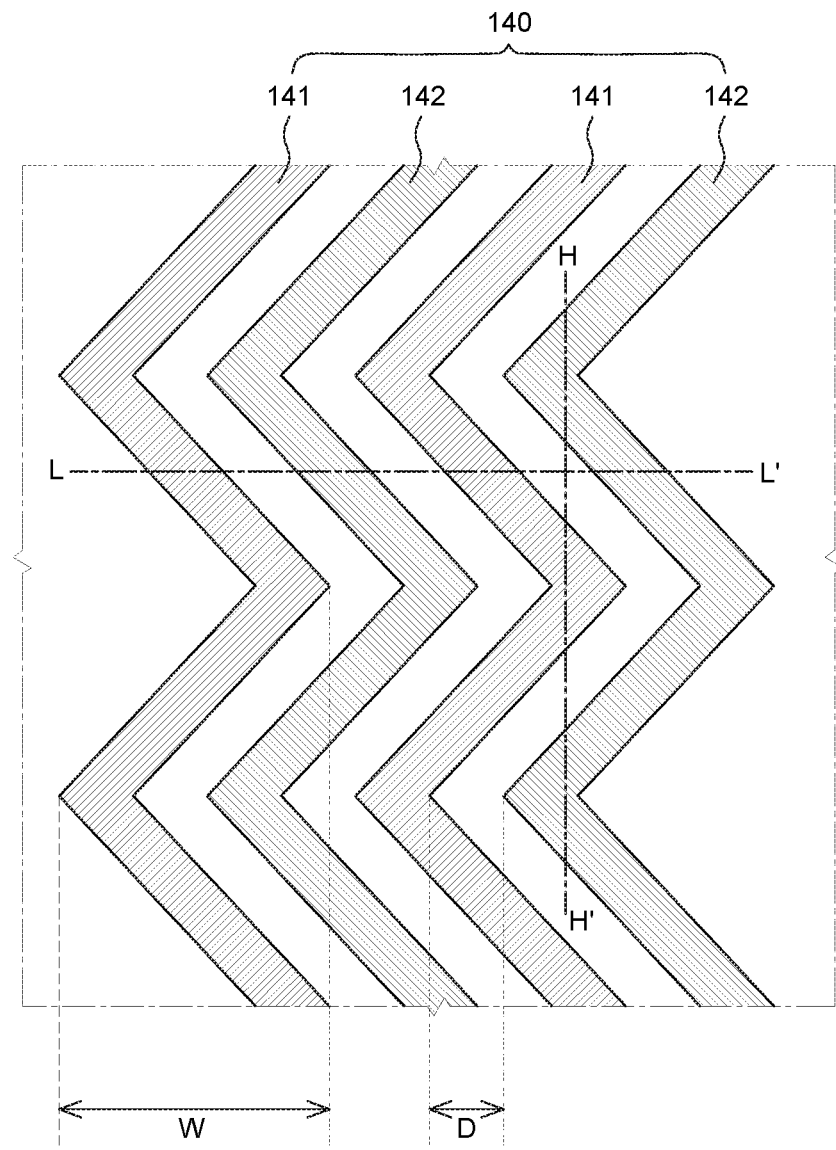
FIG. 11 is a plan view for illustrating the bending area shown in FIG. 1.

FIG. 11 is a plan view for illustrating the line structure of the bending area shown in FIG. 1.

As shown in FIG. 1, in the OLED device 100, the non-display area NA can be bent with respect to the bending axis AX, such that the four bezel widths W1, W2, W3 and W4 of the OLED device 100 can become smaller. A plurality of lines 140 is disposed in the bending area BA defined around the bending axis AX. The lines 140 disposed in the non-display area NA may include a data link line, a voltage supply link line, a gate link line, an initialization voltage link line, etc. Therefore, the plurality of lines 140 is designed to be robust against the bending stress exerted when the device is bent, to thereby suppress cracking and disconnection. In the following description, the lines 140 are collectively referred to as link lines.

To make the link lines robust against the bending stress, it is essential to implement a structure that evenly distributes as least stress as possible in a given area. The stress becomes largest if the link lines are implemented as straight lines extending in parallel with the bending direction. Accordingly, it is contemplated that the bending pattern structure of the data link lines is configured to enlarge a cross section perpendicular to the bending direction.

The bending pattern structure may include a diamond pattern that is symmetric laterally and a dual zigzag pattern. The diamond pattern occupies a very large line width. To reduce the line width, a zigzag pattern or a sine-wave pattern may be used. And, the zigzag pattern or the sine-wave pattern has a narrow spacing between the lines, such that short-circuit may be formed therebetween. The sine-wave pattern may also be referred to as an S-pattern.

Sub-pixels disposed in a column may share a data line or a voltage supply line. The number of required data link lines or voltage supply link lines maybe equal to the number of the columns. That is, as the resolution of an OLED device increases, the number of columns of the sub-pixels also increases. Therefore, it is necessary to reduce the line width of the link lines such as data link lines or voltage supply link lines or the distance between the link lines, to dispose all of the link lines in the non-display area. A bending pattern structure of link lines that can meet the above-described requirements will be described below.

FIG. 11 shows lines 140 having a zigzag bending pattern structure. The zigzag pattern is one half of a diamond pattern with respect to the center line. Therefore, the line width W can be reduced to half as compared with the diamond pattern. The lines 140 serving as the link lines may include first link lines 141 and second link lines 142 alternately arranged. The first link lines 141 and the second link lines 142 are formed on different layers and do not overlap with each other. Accordingly, it is possible to suppress a short-circuit from being formed between the first link lines 141 and the second link lines 142, and to reduce the distance D between the lines 140. Accordingly, the high-resolution OLED device 100 can be implemented.

The bending pattern structure may include a sine-wave pattern, i.e., a zigzag pattern with rounded corners, in addition to the zigzag pattern shown in FIG. 11.

Figure 12:
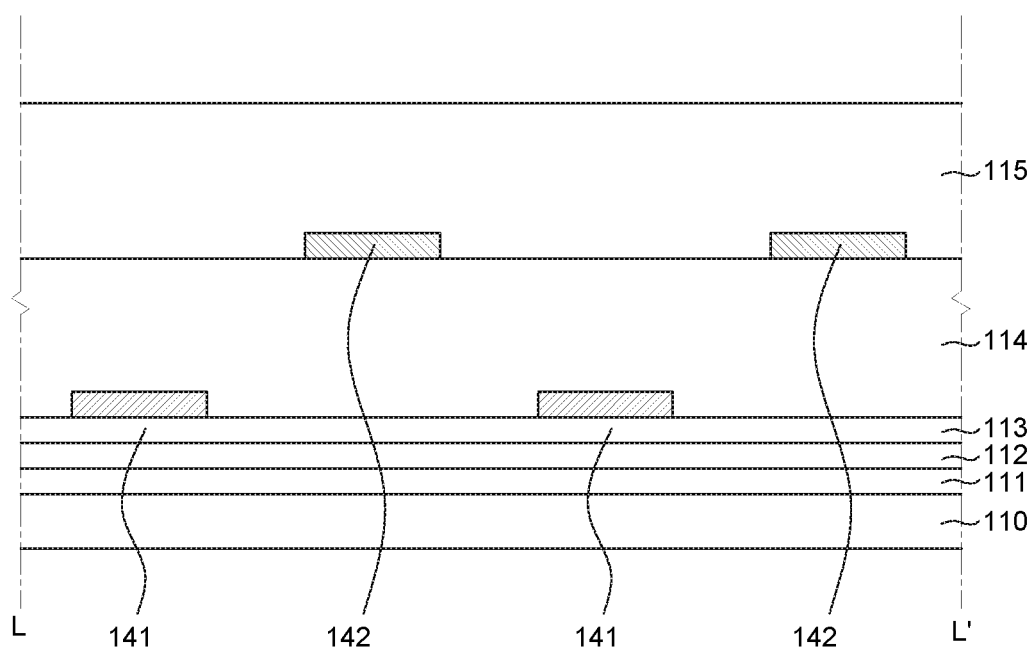
FIG. 12 is a cross-sectional view taken along line L-L' in FIG. 11.

FIG. 12 is a cross-sectional view taken along line L-L' in FIG. 11.

A buffer layer 111, a gate insulating layer 112 and an interlayer insulating layer 113 are disposed on a substrate 110, and a first link line 141 is disposed on the interlayer insulating layer 113. The first link line 141 may be, but is not limited to, formed of the same material in the same process as the source electrode 163 and the drain electrode 164 disposed in the display area DA. The first link lines 141 maybe a data link line, a voltage supply link line, a gate link line, an initialization voltage link line, etc. In the following description, it is assumed that the first link lines 141 are first data link lines for convenience of illustration. It is to be understood that the description of the first link line 141 described below can be equally applied to other types of link lines.

The first planarization layer 114 is disposed on the first link line 141, and the second link line 142 is disposed on the first planarization layer 114. The second link line 142 may be, but is not limited to, formed of the same material in the same process as the connection electrode CE disposed in the display area DA. The second link lines 142 may be a data link line, a voltage supply link line, a gate link line, an initialization voltage link line, etc. In the following description, it is assumed that the second link lines 142 are second data link lines for convenience of illustration. A second planarization layer 115 is disposed over the second link lines 142. It is to be understood that the description of the second link lines 142 described below can be equally applied to other types of link lines.

The first link lines 141 and the second link lines 142 may be connected to data lines disposed in the display area DA to transfer a signal applied from the drive IC 130.

For example, the first link line 141 may be connected to the data line disposed in an odd sub-pixel, while the second link line 142 may be connected to the data line disposed in an even sub-pixel. In an even sub-pixel, the second link line 142 is formed on the first planarization layer 114 different from the data line, and thus the second link line 142 may be connected to the data line through a contact hole formed in the first planarization layer 114 in the even sub-pixel.

Figure 13:
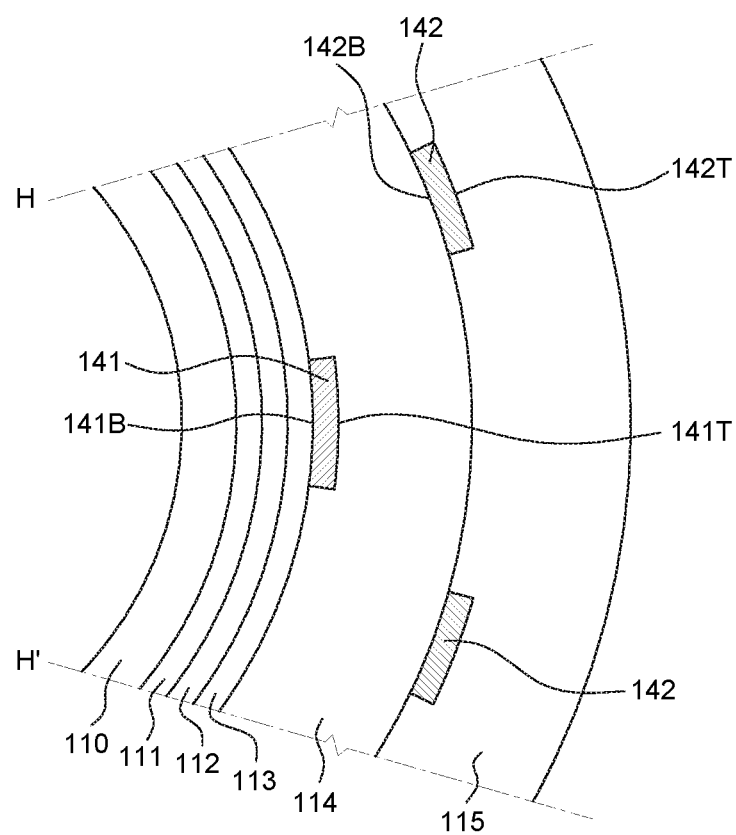
FIG. 13 is a cross-sectional view taken along line H-H' of FIG. 11.

FIG. 13 is a cross-sectional view taken along line H-H' of FIG. 11. FIG. 13 is a cross-sectional view when the bending area BA of FIG. 1 is bent. However, this is not limiting. The non-display area NA connected to the drive IC 130 may be completely folded with respect to the bending axis AX, such that bezel width of the OLED device 100 can be reduced.

When the device is bent, the first link lines 141 and the second link lines 142 disposed on different layers are subject to stress due to the bending, and may be cracked or disconnected due to the stress. In addition, a zigzag or sine-wave bending pattern structure having a smaller cross-sectional area in the direction perpendicular to the bending direction as compared with the diamond pattern may be relatively weak against external pressure and impact. Therefore, the first link lines 141 and the second link lines 142 can be protected from cracking and disconnection by disposing the anti-disconnection protective layer on the bending pattern structure.

The anti-disconnection protective layer may include the first planarization layer 114 and the second planarization layer 115. The first planarization layer 114 and the second planarization layer 115 may be disposed over the first link lines 141 and the second link lines 142, respectively.

The top surface 141T of the first link line 141 and the top surface 142T of the second link line 142 may be expanded more than the bottom surface 141B of the first link line 141 and the bottom surface 142B of the second link line 142 because the formers are more subject to the stress by the bending. If the top surface 141T of the first link line 141 and the top surface 142T of the second link line 142 are subject to stress more than they can withstand, there may be cracks from the top surface 141T of the first link line 141 and the top surface 142T of the second link line 142. Accordingly, the first link line 141 and the second link line 142 may be disconnected, causing a problem that signal transmission fails.

In this regard, by covering the top surface 141T of the first link line 141 and the top surface 142T of the second link line 142 with the first planarization layer 114 and the second planarization layer 115, respectively, the first link line 141 and the second link line 142 can be protected from cracking or disconnection.

In order to protect the first link line 141 and the second link line 142 from cracking and disconnection, the first planarization layer 114 and the second planarization layer 115 may either completely or partially cover the first link line 141 and the second link line 142.

In addition, the first link line 141 and the second link line 142 may be made of a metal material having a small Young's modulus. For example, the first link line 141 and the second link line 142 may be made of a material having a Young's modulus smaller than that of molybdenum (Mo). The Young's modulus is the modulus of elasticity, which indicates the degree of elongation and deformation of an object when it is stretched from the opposed ends. The Young's modulus is the value obtained by dividing the stress by the strain. When a metal is deformed with the same strain, the Young's modulus is proportional to the stress. Therefore, as the Young's modulus becomes smaller, deformation of an object becomes easier, so that defects such as cracking and disconnection of lines can be suppressed. The Young's modulus can be expressed by the following equation:

$$\text{Youngs' modulus } [GPa] = \frac{\text{stress}}{\text{strain}} = \frac{F/A}{(Ln - L_0)/L_0} \quad \langle\text{Equation}\rangle$$

where F denotes force, A denotes cross-sectional area, $L_0$ denotes the length of an object, and Ln denotes the length of the deformed object.

The materials usable for the first link line 141 and the second link line 142, and the Young's modular of the materials are shown in the table below:

| Material | Young's modulus[Gpa = $kN/mm^2$] |
|---|---|
| Mo | 329 |
| Al | 70 |
| Cr | 110 |
| Au | 78 |
| Ti | 116 |
| Ni | 200 |
| Nd | 41.4 |
| Cu | 130 |

The first link line 141 and the second link line 142 are made of a material having a Young's modulus smaller than that of molybdenum (Mo), and thus the first and second link lines 141 and 142 can be easily deformed when the device is bent. Therefore, it is possible to prevent the first and second link lines 141 and 142 from cracking or being disconnected. Preferably, a material having a Young's modulus of 200 GPa or less may be used as the material for the first link line 141 and the second link line 142, so that the cracking or disconnection of the first and second link lines 141 and 142 can be more reliably prevented. The embodiments of the present disclosure can also be described as follows:

According to an embodiment of the present disclosure, an organic light-emitting display (OLED) device includes a substrate having a display area including a plurality of sub-pixels each comprising an anode, an organic emitting layer and a cathode, a first data line disposed on the substrate and applying a first data voltage to a first sub-pixel emitting light of a first color and to a second sub-pixel emitting light of a second color different from the first color, and a first line disposed between the first data line and an anode overlapping the first data line among the anodes of the plurality of sub-pixels.

According to one or more embodiments of the present disclosure, a constant voltage may be applied to the first line.

According to one or more embodiments of the present disclosure, the first sub-pixel and the second sub-pixel may be alternately arranged in a same column.

According to one or more embodiments of the present disclosure, the OLED may further include a first voltage supply line applying a high-potential voltage to the first sub-pixel and the second sub-pixel, wherein the first line overlaps with the first data line among the first data line and the first voltage supply line.

According to one or more embodiments of the present disclosure, the OLED device may further include a second data line applying a second data voltage to a third sub-pixel emitting light of a third color different from the first color and the second color among the plurality of sub-pixels, a second voltage supply line applying a high-potential voltage to the third sub-pixel, and a second line disposed above the second data line, the first voltage supply line or the second voltage supply line.

According to one or more embodiments of the present disclosure, an anode of the first sub-pixel and an anode of the second sub-pixel may overlap with the first data line, an anode of the third sub-pixel may overlap with the second data line, the first line maybe electrically connected to the first voltage supply line outside the display area, and the second line maybe in contact with the second voltage supply line through a plurality of contact holes in a planarization layer disposed over the second voltage supply line.

According to one or more embodiments of the present disclosure, the first line may include a plurality of protrusions each in contact with the first voltage supply line through the respective contact holes in the planarization layer disposed over the first voltage supply line.

According to one or more embodiments of the present disclosure, an anode of the first sub-pixel and an anode of the second sub-pixel may overlap with the second data line, an anode of the third sub-pixel may overlap with the first data line, the first line may include a plurality of protrusions that is in contact with the second voltage supply line through a plurality of contact holes in a planarization layer disposed over the second voltage supply line, and the second line may be electrically connected to the first voltage supply line outside the display area.

According to one or more embodiments of the present disclosure, the second line may be electrically connected to the first voltage supply line through the plurality of contact holes in the display area.

According to one or more embodiments of the present disclosure, the OLED device may further include a first planarization layer covering the first data line, the second data line, the first voltage supply line and the second voltage supply line, and a second planarization layer on the first planarization layer, wherein the first line and the second line are disposed between the first planarization layer and the second planarization layer, and wherein the anodes of the plurality of sub-pixels are disposed on the second planarization layer.

According to one or more embodiments of the present disclosure, the first sub-pixel and the second sub-pixel may be a red sub-pixel and a blue sub-pixel, respectively, or a blue sub-pixel and a red sub-pixel, respectively, and the third sub-pixel may be a green sub-pixel.

According to one or more embodiments of the present disclosure, the OLED device may further include a connection line intersecting the first line and the second line on a same plane and electrically connecting the first line with the second line, and the first line, the second line and the connection line may form a grid pattern and may have an equal potential.

According to one or more embodiments of the present disclosure, the OLED device may further include a plurality of link lines disposed in a bending area included in a non-display area of the substrate, the non-display area surrounding the display area, and an anti-disconnection protective layer disposed on the plurality of link lines. The plurality of link lines may transfer signals to the plurality of sub-pixels, and the plurality of link lines may include a first link line and a second link line disposed in different layers.

According to one or more embodiments of the present disclosure, the plurality of link lines may include a bending pattern structure configured to enlarge a cross-sectional area of the plurality of link lines in a direction perpendicular to a direction in which the plurality of link lines is bent.

According to one or more embodiments of the present disclosure, the first link line and the second link line may be alternately arranged and may not overlap with each other.

According to one or more embodiments of the present disclosure, the plurality of link lines may transfer signals to the plurality of sub-pixels from a drive IC.

According to another embodiments of the present disclosure, an organic light-emitting display (OLED) device comprises a first data line applying a data voltage to sub-pixels emitting light of different colors, a plurality of first anodes disposed to overlap with the first data line above the first data line, and a first line disposed between the first data line and the plurality of first anodes such that the first line suppresses interference between the first data line and the plurality of first anodes when the OLED device displays a single color to thereby reduce variations in luminance among the sub-pixels comprising the plurality of first anodes.

According to one or more embodiments of the present disclosure, the first line may be supplied with a voltage for reducing parasitic capacitance between the first data line and the plurality of first anodes.

According to one or more embodiments of the present disclosure, the OLED device may further include a second data line applying data voltage to sub-pixels emitting light of a same color, the sub-pixels being different from the sub-pixels emitting light of the different colors, a plurality of second anodes disposed to overlap with the second data line above the second data line, a first voltage supply line supplying a high-potential voltage to the sub-pixels emitting light of the different colors, a second voltage supply line supplying a high-potential voltage to the sub-pixels emitting light of the same color, and a second line disposed on a layer where the first line is disposed.

According to one or more embodiments of the present disclosure, the first line may be electrically connected to the first voltage supply line or the second voltage supply line through a plurality of contact holes in a planarization layer disposed over the first voltage supply line and the second voltage supply line, so as to reduce line resistance of the first voltage supply line or the second voltage supply line.

According to one or more embodiments of the present disclosure, the OLED device may further include a connection line that is formed as a single piece with the first line and the second line and forms a grid pattern so as to reduce line resistance of the first line and the second line.

It will be apparent to those skilled in the art that various modifications and variations can be made in the organic light-emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light-emitting display (OLED) device comprising:
    a substrate having a display area including a plurality of sub-pixels each comprising an anode, an organic emitting layer and a cathode;
    a first data line disposed on the substrate and configured to apply a first data voltage to a first sub-pixel emitting light of a first color and to a second sub-pixel emitting light of a second color different from the first color; and
    a first line disposed between the first data line and an anode overlapping the first data line among the anodes of the plurality of sub-pixels,
    wherein the first line is insulated from the first data line.

2. The OLED device of claim 1, wherein a constant voltage is applied to the first line.

3. The OLED device of claim 1, wherein the first sub-pixel and the second sub-pixel are alternately arranged in a same column.

4. The OLED device of claim 1, further comprising:
    a first voltage supply line applying a high-potential voltage to the first sub-pixel and the second sub-pixel, wherein the first line overlaps with the first data line among the first data line and the first voltage supply line.

5. The OLED device of claim 4, further comprising:
a second data line applying a second data voltage to a third sub-pixel emitting light of a third color different from the first color and the second color among the plurality of sub-pixels;
a second voltage supply line applying a high-potential voltage to the third sub-pixel; and
a second line disposed above the second data line, the first voltage supply line or the second voltage supply line.

6. The OLED device of claim 5, wherein an anode of the first sub-pixel and an anode of the second sub-pixel overlap with the first data line,
wherein an anode of the third sub-pixel overlaps with the second data line,
wherein the first line is electrically connected to the first voltage supply line outside the display area, and
wherein the second line is in contact with the second voltage supply line through a plurality of contact holes in a planarization layer disposed over the second voltage supply line.

7. The OLED device of claim 6, wherein the first line comprises a plurality of protrusions each in contact with the first voltage supply line through the respective contact holes in the planarization layer disposed over the first voltage supply line.

8. The OLED device of claim 5, wherein an anode of the first sub-pixel and an anode of the second sub-pixel overlap with the second data line,
wherein an anode of the third sub-pixel overlaps with the first data line,
wherein the first line comprises a plurality of protrusions that is in contact with the second voltage supply line through a plurality of contact holes in a planarization layer disposed over the second voltage supply line, and
wherein the second line is electrically connected to the first voltage supply line outside the display area.

9. The OLED device of claim 8, wherein the second line is electrically connected to the first voltage supply line through the plurality of contact holes in the display area.

10. The OLED device of claim 5, further comprising:
a first planarization layer covering the first data line, the second data line, the first voltage supply line and the second voltage supply line; and
a second planarization layer on the first planarization layer,
wherein the first line and the second line are disposed between the first planarization layer and the second planarization layer, and
wherein the anodes of the plurality of sub-pixels are disposed on the second planarization layer.

11. The OLED device of claim 5, wherein the first sub-pixel and the second sub-pixel are a red sub-pixel and a blue sub-pixel, respectively, or a blue sub-pixel and a red sub-pixel, respectively, and
wherein the third sub-pixel is a green sub-pixel.

12. The OLED device of claim 5, further comprising:
a connection line intersecting the first line and the second line on a same plane and electrically connecting the first line with the second line,
wherein the first line, the second line and the connection line form a grid pattern and have an equal potential.

13. The OLED device of claim 1, further comprising:
a plurality of link lines disposed in a bending area included in a non-display area of the substrate, the non-display area surrounding the display area; and
an anti-disconnection protective layer disposed on the plurality of link lines,
wherein the plurality of link lines transfers signals to the plurality of sub-pixels, and
wherein the plurality of link lines comprises a first link line and a second link line disposed in different layers.

14. The OLED device of claim 13, wherein the plurality of link lines comprises a bending pattern structure configured to enlarge a cross-sectional area of the plurality of link lines in a direction perpendicular to a direction in which the plurality of link lines is bent.

15. The OLED device of claim 13, wherein the first link line and the second link line are alternately arranged and do not overlap with each other.

16. The OLED device of claim 13, wherein the plurality of link lines transfers signals to the plurality of sub-pixels from a drive IC.

17. An organic light-emitting display (OLED) device comprising:
a first data line applying a data voltage to sub-pixels emitting light of different colors;
a plurality of first anodes disposed to overlap with the first data line above the first data line; and
a first line disposed between the first data line and the plurality of first anodes such that the first line suppresses interference between the first data line and the plurality of first anodes when the OLED device displays a single color to thereby reduce variations in luminance among the sub-pixels comprising the plurality of first anodes,
wherein the first line is insulated from the first data line.

18. The OLED device of claim 17, wherein the first line is supplied with a voltage for reducing parasitic capacitance between the first data line and the plurality of first anodes.

19. The OLED device of claim 17, further comprising:
a second data line applying a data voltage to sub-pixels emitting light of a same color, the sub-pixels being different from the sub-pixels emitting light of the different colors;
a plurality of second anodes disposed to overlap with the second data line above the second data line;
a first voltage supply line supplying a high-potential voltage to the sub-pixels emitting light of the different colors;
a second voltage supply line supplying a high-potential voltage to the sub-pixels emitting light of the same color; and
a second line disposed on a layer where the first line is disposed.

20. The OLED device of claim 19, wherein the first line is electrically connected to the first voltage supply line or the second voltage supply line through a plurality of contact holes in a planarization layer disposed over the first voltage supply line and the second voltage supply line, so as to reduce line resistance of the first voltage supply line or the second voltage supply line.

21. The OLED device of claim 20, further comprising:
a connection line that is formed as a single piece with the first line and the second line and forms a grid pattern so as to reduce line resistance of the first line and the second line.

* * * * *